(12) United States Patent
Albini et al.

(10) Patent No.: US 12,718,882 B2
(45) **Date of Patent: *Aug. 25, 2026**

(54) INTEGRATED CIRCUIT INCLUDING FLASH MEMORY AND CMOS LOGIC CIRCUITRY

(71) Applicant: TEXAS INSTRUMENTS INCORPORATED, Dallas, TX (US)

(72) Inventors: Giulio Albini, Draper, UT (US); Jonathan Lane, Sandy, UT (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 104 days.

This patent is subject to a terminal disclaimer.

(21) Appl. No.: 18/362,080

(22) Filed: Jul. 31, 2023

(65) Prior Publication Data

US 2025/0046375 A1 Feb. 6, 2025

(51) Int. Cl.
*G11C 11/34* (2006.01)
*G11C 16/08* (2006.01)
*H10B 41/30* (2023.01)

(52) U.S. Cl.
CPC ............ *G11C 16/08* (2013.01); *H10B 41/30* (2023.02)

(58) Field of Classification Search
CPC ................................ G11C 16/08; H10B 41/30
USPC ..................................................... 365/185.23
See application file for complete search history.

(56) References Cited

U.S. PATENT DOCUMENTS 6,272,050 B1 * 8/2001 Cunningham ....... H10D 64/035 365/185.26
6,569,729 B1 * 5/2003 Wu ....................... H10B 12/50 257/E21.018
7,248,504 B2 * 7/2007 Kato .................. G11C 16/0425 365/185.15
7,320,913 B2 * 1/2008 Kang ................ H10D 30/6892 438/257
9,406,687 B1 * 8/2016 Yang .................. H10D 30/6892
9,583,591 B2 * 2/2017 Chuang ................ H10D 64/017
9,673,210 B1 * 6/2017 Thees .................. H10D 64/017
10,325,918 B2 * 6/2019 Wu ........................ H10B 41/35
10,872,898 B2 * 12/2020 Chen ...................... H10B 43/40
10,943,996 B2 * 3/2021 Wu ...................... H10D 64/035
10,950,611 B2 * 3/2021 Wu ........................ H10B 41/40
(Continued)

FOREIGN PATENT DOCUMENTS

CN 104091803 A * 10/2014 ........... H10D 64/514
JP 2009267216 A * 11/2009

OTHER PUBLICATIONS

International Search Report mailed May 7, 2024.

*Primary Examiner* — Viet Q Nguyen
(74) *Attorney, Agent, or Firm* — Yudong Kim; Frank D. Cimino

(57) ABSTRACT

An integrated circuit (IC) including Flash memory and CMOS logic circuitry and a method of fabrication thereof is disclosed. The IC comprises a substrate including a recessed area of a first region, a Flash memory cell gate stack formed in the recessed area, a wordline (WL) transistor formed in the recessed area and coupled with the Flash memory cell gate stack, the WL transistor including a WL gate formed over a first gate oxide layer exclusive of nitridation, and a transistor formed in a second area of the substrate separate from the recessed area, the transistor forming at least a portion of logic circuitry of the IC and including a second gate oxide layer having nitridation.

22 Claims, 27 Drawing Sheets

(56) References Cited

U.S. PATENT DOCUMENTS

| | | | | |
|---|---|---|---|---|
| 2009/0200612 | A1* | 8/2009 | Koldiaev | H10B 12/05 257/E29.166 |
| 2013/0253690 | A1* | 9/2013 | Fukumura | H10D 30/0413 700/121 |
| 2015/0054044 | A1* | 2/2015 | Perera | H10B 41/43 257/314 |
| 2016/0056250 | A1* | 2/2016 | Chuang | H10D 30/0413 257/326 |
| 2016/0181266 | A1* | 6/2016 | Chuang | H10D 64/035 257/316 |
| 2016/0260728 | A1* | 9/2016 | Chen | H10B 41/43 |
| 2016/0307911 | A1* | 10/2016 | Wu | H10B 41/40 |
| 2016/0314846 | A1* | 10/2016 | Muller | G11C 16/16 |
| 2016/0365350 | A1 | 12/2016 | Chuang | |
| 2017/0110469 | A1 | 4/2017 | Yi | |
| 2017/0125429 | A1* | 5/2017 | Su | H10D 30/0411 |
| 2018/0047738 | A1* | 2/2018 | Richter | H10D 87/00 |
| 2018/0151582 | A1 | 5/2018 | Wu | |
| 2018/0315765 | A1* | 11/2018 | Lin | H10B 41/49 |
| 2019/0312045 | A1* | 10/2019 | Bo | H10D 30/0411 |
| 2019/0393235 | A1 | 12/2019 | Teng | |
| 2020/0168701 | A1* | 5/2020 | Lin | H10D 62/115 |
| 2021/0183659 | A1* | 6/2021 | Lin | H01L 21/76283 |
| 2021/0249429 | A1* | 8/2021 | Liu | H10D 64/035 |
| 2021/0376120 | A1* | 12/2021 | Chen | H10D 64/62 |
| 2022/0270943 | A1* | 8/2022 | Chen | H10D 64/258 |
| 2025/0079415 | A1* | 3/2025 | Albini | H01L 25/16 |

* cited by examiner

INTEGRATED CIRCUIT INCLUDING FLASH MEMORY AND CMOS LOGIC CIRCUITRY

FIELD OF THE DISCLOSURE

Disclosed implementations relate generally to the field of integrated circuits (ICs) and IC fabrication. More particularly, but not exclusively, the disclosed implementations relate to an IC including Flash memory and CMOS logic circuitry.

BACKGROUND

A non-volatile memory (NVM) bitcell is an electronic element that is configured to store information. A threshold voltage can be used to discriminate between logic levels of the bitcell, such as a logic low level ("0") or a logic high level ("1"). This stored value may sometimes be referred to as information (or a bit), which may be read by sense amplifier circuitry. Although integrating an NVM array with additional circuitry, e.g., logic circuitry, in the same IC device is a desirable goal for the semiconductor manufacturing industry, it is not without challenges as will be set forth below.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

Examples of the present disclosure are directed to an IC device including Flash memory and CMOS logic circuitry fabricated on a single semiconductor die.

In one example, an IC device including Flash memory and CMOS logic circuitry is disclosed. The IC device comprises a substrate including a recessed area formed in a first region, a Flash memory cell gate stack formed in the recessed area, a wordline (WL) transistor formed in the recessed area and coupled with the Flash memory cell gate stack, the WL transistor including a WL gate formed over a first gate oxide layer exclusive of nitridation, and a transistor formed in a second area or region of the substrate separate from the recessed area, the transistor forming at least a portion of logic circuitry of the IC and including a second gate oxide layer having nitridation.

In one example, a method of fabricating an IC device containing Flash memory and CMOS logic circuitry is disclosed. The method may comprise, among others, forming a recessed area in a substrate, forming a Flash memory cell gate stack in the recessed area, forming a WL transistor in the recessed area, the WL transistor coupled with the Flash memory cell gate stack, where the WL transistor includes a WL gate formed over a first gate oxide layer exclusive of nitridation, and forming a transistor in a second area of the substrate separate from the recessed area, where the transistor forms at least a portion of logic circuitry of the IC and includes a second gate oxide layer having nitridation. In one implementation, the recessed area may have a depth of about 1000 Å to 1200 Å from the second gate oxide layer. In one implementation, the second gate oxide layer is substantially coplanar with a top surface of the Flash memory cell gate stack. In one implementation, the Flash memory cell gate stack, the WL transistor and associated common erase gate (EG) are formed before forming the transistor in the second area.

BRIEF DESCRIPTION OF THE DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, such feature, structure, or characteristic in connection with other implementations may be feasible whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

DETAILED DESCRIPTION

Figure 1:
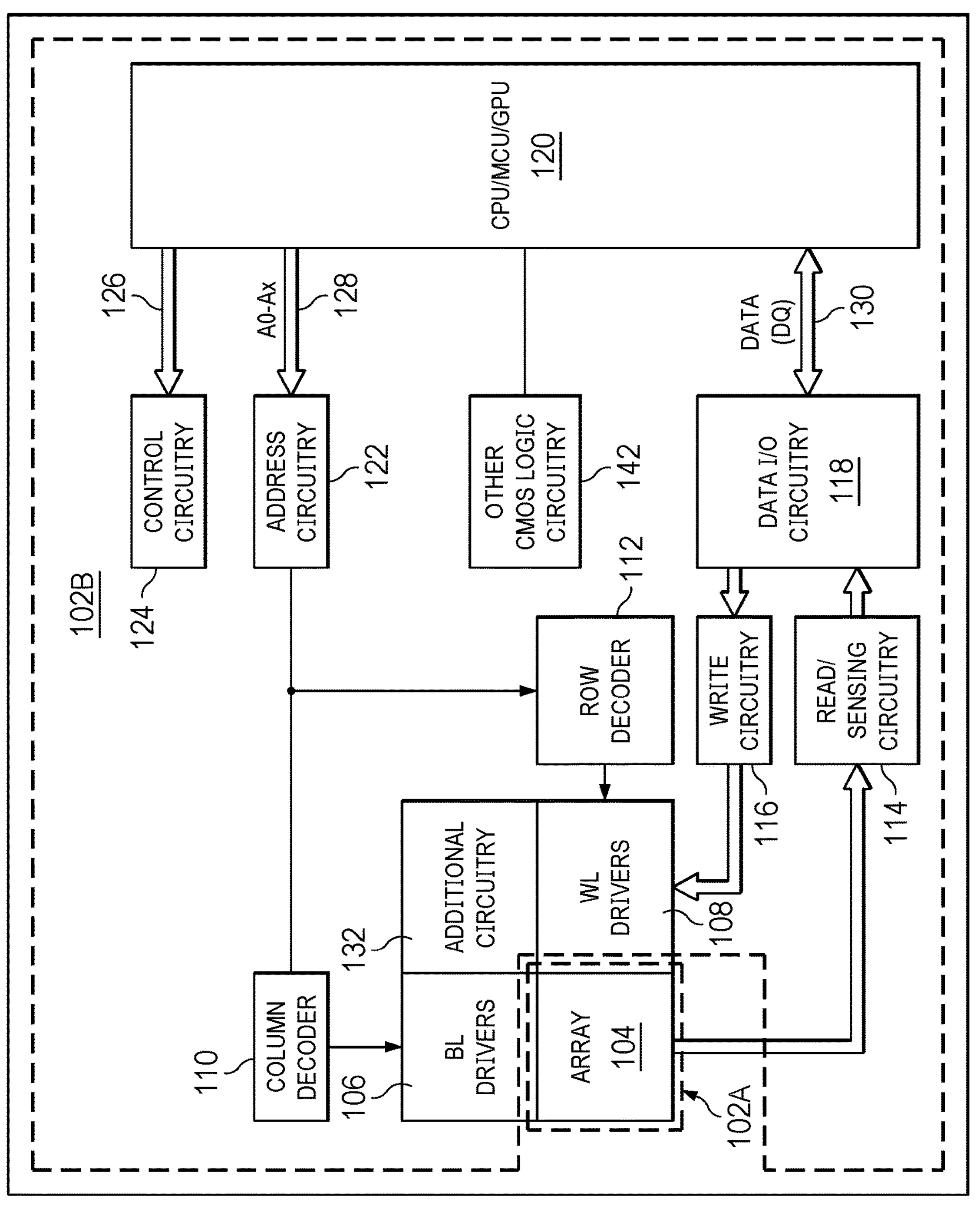
FIG. 1 depicts a block diagram of an integrated circuit (IC) including Flash memory and CMOS logic circuitry according to some examples of the present disclosure.

Examples of the disclosure are described with reference to the attached Figures where like reference numerals are generally utilized to refer to like elements. The Figures are not drawn to scale and they are provided merely to illustrate examples. Numerous specific details, relationships, and methods are set forth below to provide an understanding of one or more examples. However, it should be understood that some examples may be practiced without such specific details. In other instances, well-known subsystems, components, structures and techniques have not been shown in detail in order not to obscure the understanding of the examples. Accordingly, the examples of the present disclosure may be practiced without such specific components.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. Further, in one or more examples set forth herein, generally speaking, an element, component or module may be configured to perform a function if the element may be programmed for performing or otherwise structurally arranged to perform that function.

Without limitation, examples of an IC including Flash memory and CMOS logic circuitry and a method of manufacturing the same will be set forth below in the context of a Flash memory cell architecture based on a split-gate architecture.

Flash memory is a non-volatile storage medium that may store information in an array of memory cells, also referred to as bitcells. This stored information (or "bits") can be electrically erased, programmed, and read. In some cases, an array of floating-gate transistor bitcells may be used in creating a Flash memory circuit or device. A floating-gate transistor bitcell resembles a standard metal-oxide-field-effect-transistor (MOSFET) except that the floating-gate transistor bitcell includes multiple gates (e.g., a control gate overlying an electrically isolated floating gate). An electrical state of a bitcell can be used to define a logic level such as a logic low level (e.g., a digital low or "0") or a logic high level (e.g., digital high or "1") depending on the Boolean logic used by a sense circuit for reading the data in a read operation. This defined logic level may sometimes be referred to as information (or a bit) stored in the bitcell.

Storage of information may be effectuated using changes in the floating gate characteristics of the bitcells. The threshold voltage ($V_T$) of a floating-gate type transistor bitcell may change because of the presence or absence of a charge trapped in its floating gate due to electrical isolation. The trapped charge alters the threshold voltage (relative to the unchanged threshold voltage) of the floating-gate transistor bitcell. For instance, in an example NMOS-based Flash implementation, the threshold voltage is increased when electrons are trapped in the floating gate of the bitcell (e.g., a "programmed" bitcell). On the other hand, the threshold voltage is decreased when electrons are depleted in the floating gate of an NMOS bitcell (e.g., an "erased" bitcell). Accordingly, when a voltage is applied to the control gate of a bitcell of an NMOS-based Flash memory array during the read operation, the bitcell is conductive in an erased state and nonconductive in a programmed state, where each state is operative for generating a corresponding read current ($I_{READ}$) that is provided to a sense amplifier for sensing the data. In an example arrangement, the sense amplifier may be configured to determine the data relative to another current, referred to as a reference current ($I_{REF}$). In PMOS-based Flash implementation, these relationships are opposite, in that the PMOS bitcells are conductive in programmed state and non-conducting in erased state. In general, regardless of whether PMOS-based or NMOS-based NVM is implemented, a read current generated when the bitcell is conducting may be referred to as "ON" read current ($I_{ON}$), indicating a logic level of a first type. Similarly, a read current generated when the bitcell is non-conducting may be referred to as "OFF" read current ($I_{OFF}$) that is indicative of a logic level of a second type complementary to the first type.

In some implementations, floating-gate transistor bitcells may utilize a split-gate architecture to store bits, where a split-gate Flash bitcell may include more than one transistor. For example, a split-gate Flash memory bitcell may have a gate portion (referred to as a wordline gate) adjacent to the control gate that is disposed over the floating gate, such that the channel of the memory bitcell is controlled by the wordline gate as well as the floating gate. This arrangement causes the split-gate Flash memory bitcell to act as two transistors operating in series, equivalent to 1.5 transistors (1.5T) per cell in some implementations, where two Flash bitcells may share a source or a drain (depending on NMOS or PMOS implementation). Similarly, in some configurations, the split-gate Flash bitcell can have a 2T configuration based on two transistors. In general operation, a combination of one or more of the gates of a split-gate bitcell can be configured to program, erase, and/or read the bitcell.

Embedded Flash memory (eFlash) (e.g., one or more Flash bitcell arrays integrated with other circuitry such as CMOS logic circuitry on a single semiconductor die) is a key enabling technology for many programmable semiconductor products requiring small form factor and low-power processing. For example, microcontrollers use eFlash to store program instructions (code) as well as data on which processing is performed using logic circuitry configured as a central processing unit (CPU) core. Many Internet-of-Things (IoT) devices use eFlash to enable smart, flexible, and secure products that can be updated wirelessly, or over-the-air (OTA). Further, electronic devices with eFlash may be configured to enable a wide range of products from smart cards and wearables to factory automation systems and autonomous vehicles, to mention a few.

Although the integration of non-volatile Flash memory (and/or other types of NVM) with CMOS logic circuitry is highly desirable, fabricating Flash memory and CMOS logic on the same die remains challenging because of, among others, the requirement of managing different vertical topographies with respect to the logic circuitry and Flash memory due to the presence of a floating gate in the memory cells. In certain process flows where CMOS logic and Flash memory portions are fabricated substantially concurrently or in parallel, logic gate definition continues to be a highly demanding task when the cell gate stacks are already defined, thereby presenting a steep step height during the processing of CMOS logic gates. Because of the significant disparities in the aspect ratios between the Flash array features and logic circuitry structures, various processing stages tend to become highly susceptible to errors, thereby impacting the overall die yield, especially in advanced technology nodes that continue to scale to smaller geometries.

Examples of the present disclosure recognize the foregoing challenges and accordingly provide a technical solution for fabricating Flash memory and CMOS logic circuitry in an integrated process flow where Flash memory cells may be processed and substantially completed in a recessed area of the semiconductor substrate. Subsequently, the formation of logic circuitry may be fabricated in a non-recessed area of the semiconductor substrate. In some arrangements, the depth of the recessed area may be optimized such that a gate oxide layer formed in the non-recessed area for the logic circuitry may be substantially coplanar with respect to a top surface of the Flash memory cells, thereby reducing aspect ratio disparities that would otherwise be prevalent in certain process flows.

Whereas various examples of the present disclosure may be beneficially applied to manufacturing electronic devices including embedded Flash memory based on the split-gate architecture, the teachings herein are not limited thereto and may be practiced in the manufacture of any NVM (e.g., Flash memory based on architectures other than the split-gate architecture) integrated with a broad range of CMOS logic circuits as well as other memory such as DRAM, SRAM, etc., in a single semiconductor die. While such examples and variations may be expected to reduce manufacturing defects that could otherwise reduce yields, reliability or electrical performance, no particular result is a requirement of the present disclosure unless explicitly recited in a particular claim.

Referring now to FIG. 1, depicted therein is a block diagram of an integrated circuit (IC) including Flash memory and CMOS logic circuitry according to some examples of the present disclosure. In one arrangement, IC 100 is illustrative of an electronic device fabricated on any suitable semiconductor substrate, where one or more Flash memory arrays, e.g., array 104, may be formed in one or more recessed areas, e.g., area 102A, and one or more remaining circuit portions of IC 100 may be formed in one or more non-recessed areas, e.g., area 102B, of the semiconductor substrate. Depending on the level of integration and/or functional implementation, the remaining circuit portions may include various types of electronic circuitry such as, without limitation, field-programmable gate array (FPGA) circuitry, graphics processing unit (GPU) circuitry, digital signal processor (DSP) circuitry, system-on-chip (SoC) circuitry, microprocessor (MPU) circuitry, microcontroller (MCU) circuitry, application-specific integrated circuit (ASIC) circuitry, programmable array logic (PAL) circuitry, generic array logic (GAL) circuitry, programmable logic device (PLD) circuitry, wordline driver circuitry, bitline driver circuitry, row address decoding circuitry, column address decoding circuitry, mixed-signal circuitry, analog circuitry, transducer circuitry, microelectromechanical systems (MEMS) circuitry, sense amplifier circuitry, data input/output (I/O) circuitry, neural processing unit (NPU) circuitry, artificial intelligence (AI) processing unit (AIPU) circuitry, volatile memory circuitry, macrocell array (MCA) circuitry, and programmable logic array (PLA) circuitry. For purposes of the present disclosure, a description of IC 100 will be set forth below as a representative example of an electronic device including an embedded Flash memory array, e.g., array 104, integrated with a plurality of circuits illustrative of CMOS logic circuitry and other circuitry, that may be fabricated on a single semiconductor die according to the examples herein.

In some arrangements, Flash memory array 104 may comprise a plurality of Flash memory cells based on a split-gate cell architecture, which may be formed in a first region of the semiconductor die having the recessed area 102A as will be discussed in further detail below. Whereas a single Flash memory array is shown in FIG. 1 for simplicity, some examples of the IC device 100 may include multiple arrays, each having a respective set of memory cells arranged in corresponding rows (e.g., wordlines) and columns (e.g., bitlines). Depending on implementation, appropriate wordline driving circuitry 108 and bitline driving circuitry 106 may be operably coupled to the Flash memory array 104. Additional circuitry 132, which may drive lines of the Flash memory array 104 other than bitlines and wordlines may also be operatively associated with the Flash memory array 104 in some examples. In general, Flash memory cells (also referred to as bitcells in some examples) arranged in the same row share a common wordline, and each wordline may be driven by a wordline driver in wordline driving circuitry 108. Likewise, Flash memory cells arranged in the same column share a common bitline, and each bitline may be driven by a bitline driver in bitline driving circuitry 106.

In some examples, IC device 100 may include suitable processing circuitry 120, which may be configured to control the general operation of the device 100. Depending on implementation, processing circuitry 120 may provide the processing capability to execute an operating system, programs, user and application interfaces, and any other functions of the device 100. Accordingly, the processing circuitry 102 may include a general-purpose or application-specific (ASIC) processor based upon any known or heretofore unknown CPU architectures, FPGA circuitry, GPU/DSP circuitry, embedded MCU/MPU circuitry, and/or related circuitry, as previously noted.

By way of example, instructions or data to be processed by the processing circuitry 120 may be stored in the Flash memory array 104. Depending on application, the Flash memory array 104 may be configured to store a variety of information used for various purposes. For instance, the Flash memory array 104 may store firmware, such as a basic input/output system (BIOS), an operating system, various programs, applications, or any other routines that may be executed on or by the IC device 100, such as user interface functions, processor functions, and so forth. In general operation, the processing circuitry 120 may issue suitable read or write commands to retrieve data from or write data to array 104, respectively.

In some examples, the IC device 100 may include address buffer circuitry 122, which may be configured to latch address signals provided on an address bus 128 coupled to the processing circuitry 120. Address signals may be received and decoded by a row decoder 112 and a column decoder 110 to access one or more particular locations of the Flash memory array 104. For example, a wordline may be selected based upon a portion of an address value that identifies a row of the array 104, and a bitline may be selected based upon a portion of the address value that identifies a column of the array 104. The number of address input connections provided as address bus 128 depends upon the density and architecture of the Flash memory array 104. Further, appropriate sense amplifier circuitry 114 and write circuitry 116 may be provided in conjunction with data input/output (I/O) circuitry 118 for facilitating read/write operations with respect to the Flash memory array 104, where data to be stored or retrieved may be provided via a data bus 130.

In some examples, the IC device 100 may include command control circuitry 124 operable to decode command signals provided from the processing circuitry 120 by way of a control bus 126, where appropriate command signals may be provided to control the operations relative to the Flash memory array 104. For instance, the command signals may include read, program, and erase commands for reading data from, write data to, or selectively erase bitcells of the Flash memory array 104. In still further examples, various other types of CMOS logic circuitry 142 may be provided as part of the IC device 100, which may be fabricated in the non-recessed area or region 102B of the semiconductor substrate along with the other circuit portions of the device 100 set forth above.

Whereas various types of circuits have been described above in reference to an embedded Flash memory implementation, certain circuits such as, bitline drivers, wordline drivers, sense amplifier circuitry, row/column decoders, etc. (generally referred to as peripheral circuits) may also be present in standalone Flash memory devices, which may be fabricated in a non-recessed area of the semiconductor substrate while the bitcell array portion may be fabricated in a recessed area of the semiconductor substrate according to the teachings herein. Accordingly, regardless of whether an example implementation involves embedded Flash memory or a standalone Flash memory device, circuits other than the Flash bitcell array of an electronic device may be broadly defined as "CMOS logic circuitry" that may be fabricated in the non-recessed area of a substrate after the formation of Flash memory cells in the recessed area of the substrate as will be set forth in detail further below.

Figure 2A:
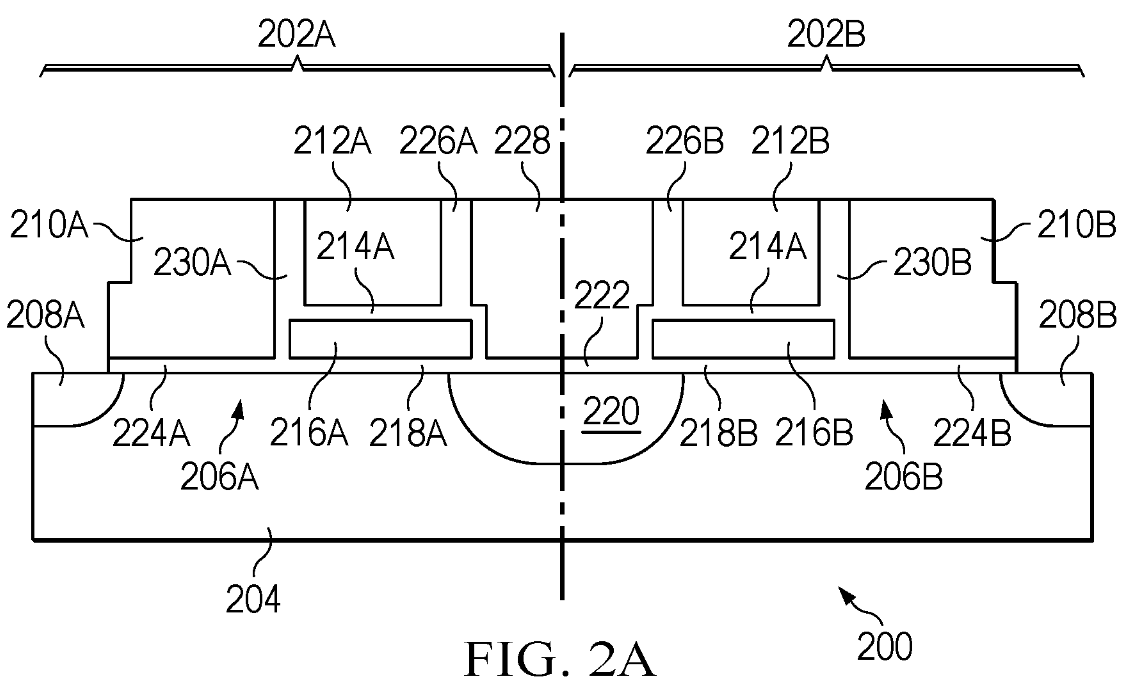
FIG. 2A depicts a cross-sectional view of a pair of Flash memory bitcells that may be fabricated in a recessed area of an IC substrate in an integrated process flow for fabricating embedded Flash memory and CMOS logic circuitry according to some examples of the present disclosure.
Figure 2B:
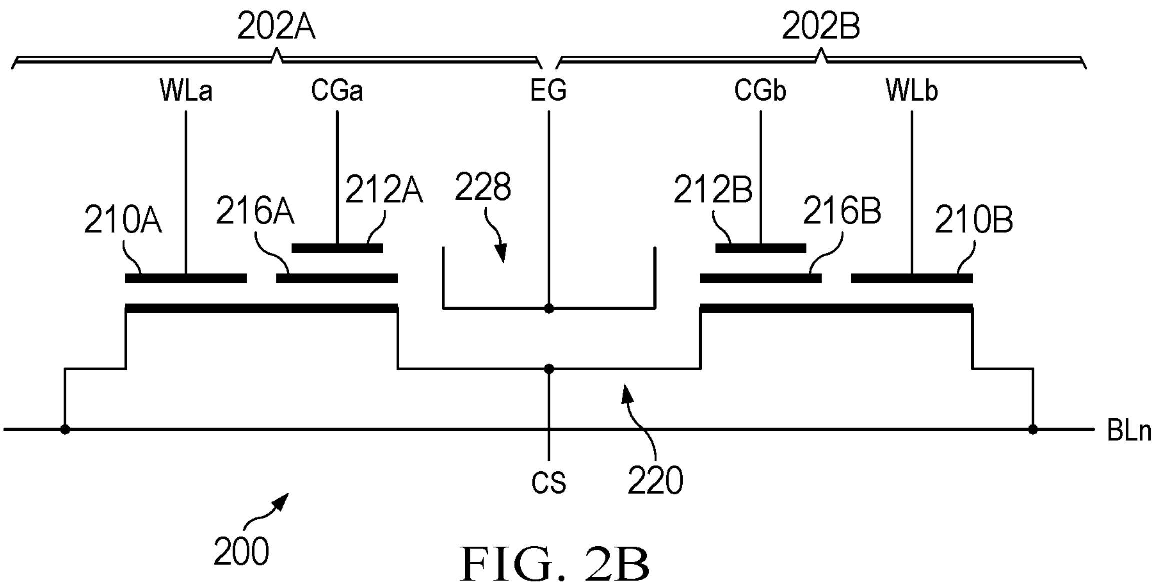
FIG. 2B depicts a schematic representation of the pair of Flash memory bitcells depicted in FIG. 2A.

FIG. 2A depicts a cross-sectional view of a pair of adjacent Flash memory cells that may be fabricated in a recessed substrate area according to some examples of the present disclosure. FIG. 2B depicts a schematic representation of the Flash memory cells depicted in FIG. 2A. The pair of Flash memory cells depicted in FIGS. 2A and 2B are examples of or include aspects of Flash memory cells based on a split-gate cell architecture. As depicted in FIGS. 2A and 2B, the Flash memory cells include a control gate (CG), a wordline (WL), a floating gate (FG), and an erase gate (EG), where a common source (CS) terminal may be shared between two adjacent bitcells that each have a drain coupled to a bitline. Taking FIGS. 2A and 2B together, a description of the structure and general operation of example Flash memory cells is set forth below.

In an example arrangement, memory cell pair 200 comprises a first memory cell 202A and a second memory cell 202B coupled together to a same bitline BLn and may form adjacent memory cells in a column of a Flash memory array, e.g., array 104 shown in FIG. 1. Memory cells 202A and 202B may include a substrate 204, which may include a portion of a recessed area, e.g., recessed area 102A, of a semiconductor die formed in a semiconductor wafer (not specifically shown). In some examples, substrate 204 may comprise a semiconductor material of a first conductivity type, such as p-type. Because memory cells 202A and 202B have an identical structure, a description of memory cell 200A is provided herein in detail, which is equally applicable to memory cell 202B. With respect to the memory cell 202A, substrate 204 includes a first region 220 and a second region 208A, both of which are of a second conductivity type, such as n-type. The first region 220 may represent a source region and the second region 208A may represent a drain region, which may be connected to the bitline BLn. The source region 220 may be shared by the memory cells 202A, 202B, which may be connected to a common source line CS. A channel region 206A may be disposed between the first region 220 and the second region 208A, which provides for conduction of charges therebetween.

A wordline WLa forms or is otherwise connected to a select gate 210A formed over a first portion of the channel region 206A, (e.g., a portion immediately abutting the second region 208A) and insulated therefrom by a gate oxide 224A disposed between the select gate 210A and the substrate 204. Depending on implementation, the select gate 210A (also referred to as a wordline gate) may extend over a portion of the second region 208A, and may be configured to operate as a wordline transistor (also referred to as an access transistor) with respect to the memory cell 202A. A floating gate (FG) 216A is positioned over a second portion of the channel region 206A, where the floating gate 216A is laterally spaced from and disposed adjacent to the select gate 210A. The floating gate 216A is insulated from the substrate 204 by a gate oxide 218A, and may extend over a portion of the first region 220.

A control gate (CG) 212A, also referred to as a coupling gate, is disposed over the floating gate 216A and is insulated therefrom by an oxide layer 214A, thereby forming a gate stack of the memory cell 202A. For purposes of some examples of the present disclosure, a Flash memory cell or bitcell, may include a wordline gate or transistor coupled to a gate stack or a storage stack in a split-gate architecture. The control gate 212A is also positioned between the select gate 210A and an erase gate 228, and is coupled to a control gate line CGa as shown in FIG. 2B. A vertical spacer 230A, which may comprise one or more dielectric layers, insulates the select gate 210A from the control gate 212A and the floating gate 216A. The erase gate 228 is disposed over the first region 220 of the substrate 204 and is insulated therefrom by a gate oxide layer 222. The erase gate 228 is also arranged adjacent to the floating gate 216A and the control gate 212A, and is insulated therefrom by another vertical spacer 226A that may include one or more suitable dielectric layers. As depicted in FIGS. 2A and 2B, the erase gate 228 is connected to a common erase gate (EG) line shared by the memory cells 202A and 202B.

The adjacent memory cell 202B shown in FIGS. 2A and 2B has a structure identical to the memory cell 202A, as noted previously, and forms a mirror image thereof with respect to the vertical dashed line separating the two memory cells 202A, 202B and passing through the shared erase gate 228 and source region 220, as depicted in FIG. 2A. Like components in the adjacent memory cell 202B are denoted with the same reference number or initialism as corresponding components in the memory cell 202A, but with a "b" or "B" appended thereto instead of an "a" or 'A", as applicable. For example, component 216B is a floating gate for the memory cell 202B, whereas like component 216A is the floating gate for memory cell 202A, where components 216A and 212A form a gate stack of the memory cell 202A, and components 216B and 212B form a gate stack of the memory cell 202B. In some examples, the control gates 212A, 212B of memory cells 202A, 202B, respectively, may be configured to share a common control gate driver. For example, although FIG. 2B shows separate control gate lines CGa and CGb connected to control gates 212A, 212B, respectively, the control gate lines CGa and CGb may be driven by the same control gate driver (not specifically shown in the Figures).

The structure of the transistors shown in FIGS. 2A and 2B of each of the memory cells 202A and 202B provides for a separate select gate and control gate as an example of the split-gate architecture according to some examples herein. Whereas the components described in FIG. 2A for providing insulation between the various depicted structures of the memory cells 202A and 202B, such as, elements 224A/B, 218A/B, 214A/B, 222, etc., are referred to as "oxides," which may be formed using any suitable dielectric material, such as an oxide, a nitride, or a combination of an oxide and nitride, and may comprise one or more layers or sublayers of varying thicknesses. By way of illustration, the inter-gate dielectric layer 214A/B providing insulation between the control gate 212A/212B and corresponding floating gate 216A/216B may be formed from an oxide-nitride-oxide (ONO) layer in a "Flash First" fabrication flow for forming the memory cells 202A/202B in a recessed area of a semiconductor substrate, as will be set forth in detail further below.

In general operation, the memory cells 202A and 202B may be operated upon in response to commands received by suitable control circuitry of an IC device, e.g., control circuitry 124 of IC device 100, shown in FIG. 1. When either or both memory cells 202A and/or 202B are selected in response to a command, depending on whether the command indicates a read, program, or erase operation, appropriate voltages corresponding to the indicated operation may be applied to the select gate 210A/B, control gate 212A/B, erase gate 228, and source region 220 of the selected memory cell(s). A selected memory cell may refer to one identified (e.g., by an address) along with a received command, whereas an unselected memory cell is one not so identified.

Though not shown specifically in FIG. 1, an example IC device 100 may include various driver circuits for the control gates (e.g., driving the CG lines), for the source terminals (e.g., driving the CS lines) and the erase gates (e.g., driving the EG lines) associated with a Flash memory array, e.g., array 104, comprising a plurality of bitcells 202A/202B described in detail above. In some examples, such driver circuitry as well as wordline driver circuitry (e.g., WL drivers 108) and bitline driver circuitry (e.g., BL drivers 106) and decoding circuitry may be considered as peripheral circuits of the memory array 104 as noted previously, which may be formed in a non-recessed substrate area (e.g., in area 102B) after the formation of the memory cells of array 104 in a recessed substrate area (e.g., in area 102A) according to some examples herein.

Figure 3:
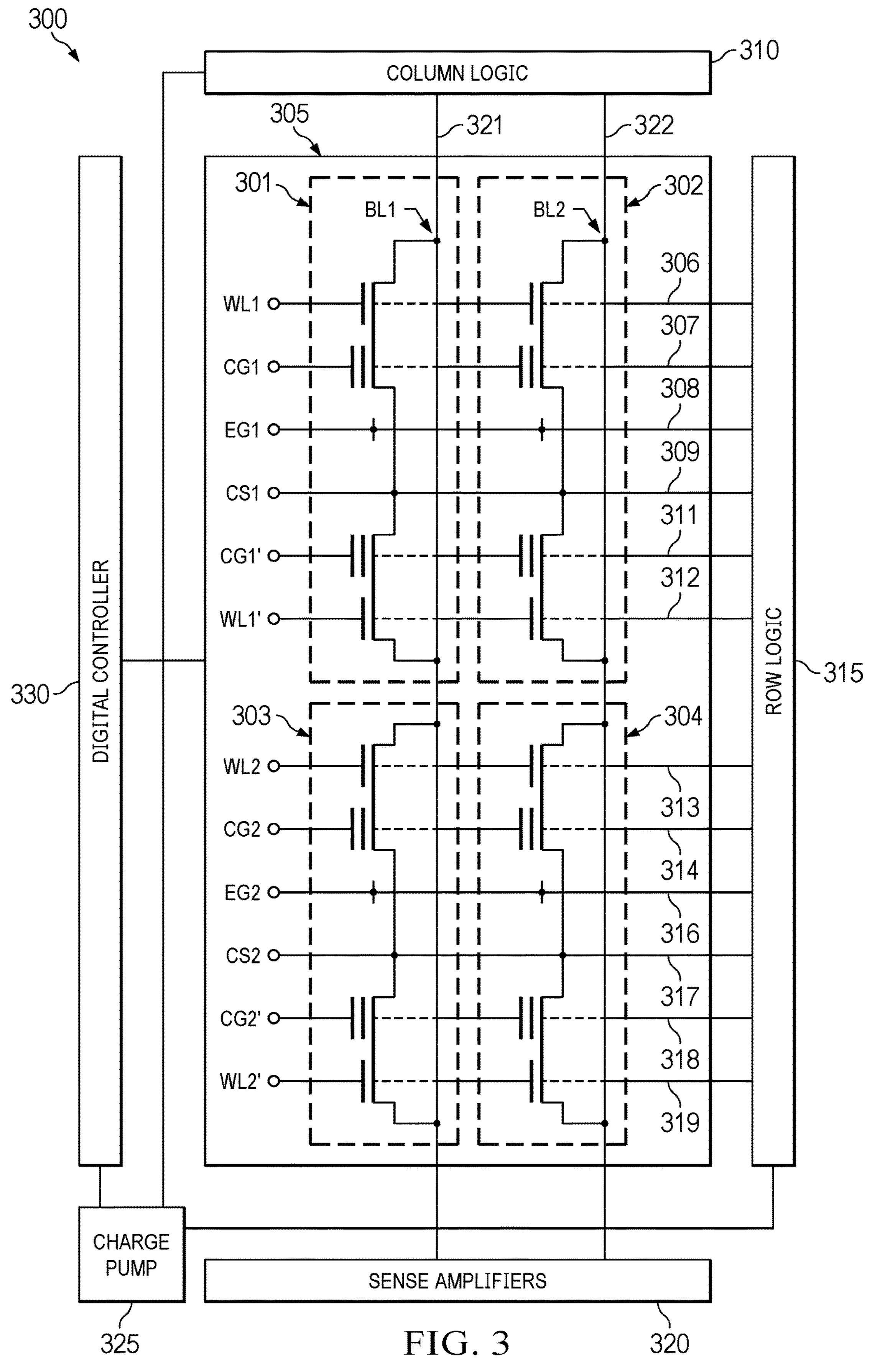
FIG. 3 depicts an IC portion including a Flash memory array and associated peripheral circuitry, where the Flash memory array may include a plurality of bitcells exemplified by the bitcells of FIGS. 2A/2B and may be embedded in conjunction with various types of CMOS logic circuitry according to some examples of the present disclosure.

FIG. 3 depicts an IC portion including a Flash memory array and associated peripheral circuitry, where the Flash memory array may include a plurality of bitcells exemplified by the bitcells of FIGS. 2A/2B and may be embedded in conjunction with various types of CMOS logic circuitry according to some examples of the present disclosure. In one arrangement, IC portion 300 includes a bitcell array 305 formed in a recessed substrate area (which is representative of Flash memory array 104 shown in FIG. 1), a row logic circuit (hereinafter "row logic") 315, a column logic circuit (hereinafter "column logic") 310, a sense amplifier (SA) block 320 (e.g., including a plurality of sense amplifiers), a bitcell array controller (hereinafter "digital controller") 330, and charge pump circuitry (hereinafter "charge pump") 325.

A bitcell array, in some examples, includes multiple bitcells or bitcell pairs coupled in series and/or in parallel depending on memory cell organization. For example, the bitcell array 305 includes bitcell pairs 301, 303 coupled in series, and bitcell pairs 302, 304 also coupled in series. As depicted, the series-coupled bitcell pairs 301, 303 are coupled to the series-coupled bitcell pairs 302, 304 in parallel, such that the bitcell pairs 301 and 302 are connected and the bitcell pairs 303, 304 are connected. Some of the terminals of the parallel-connected bitcell pairs are electrically coupled to each other, and are further coupled to the row logic 315. For instance, wordlines associated with a first row of bitcells forming pairs 301, 302, respectively, are coupled to each other at a terminal WL1, which is coupled to the row logic 315 via a connector 306. Likewise, control gates of the first row of the bitcells forming the pairs 301, 302 are coupled to each other at a terminal CG1, which is coupled to the row logic 215 via a connector 307; erase gates of the first row of the bitcell pairs 301, 302 are coupled to each other at a terminal EG1, which is coupled to the row logic 315 via a connector 308; common sources of the bitcell pairs 301, 302 are coupled to each other at a terminal CS1, which is coupled to the row logic 315 via a connector 309. The CS1 and EG1 terminals in the depicted example array architecture of FIG. 3 are shared with a second row of bitcells of the pairs 301, 302, consistent with the cell architecture shown in FIGS. 2A and 2B described above. Accordingly, with respect to the second row of bitcells of the pair 301, 302, the corresponding set of control gates associated therewith are coupled to each other at a terminal CG1', which is coupled to the row logic 315 via a connector 311; the other set of wordlines associated with the second row bitcells of the pairs 301, 302 are coupled to each other at a terminal WL1', which is coupled to the row logic 315 via a connector 312.

Similarly, in the case of bitcell pairs 303, 304, the wordlines of a first row of bitcells of the pair 303, 304 are coupled to each other at a terminal WL2, which is coupled to the row logic 315 via a connector 313; control gates of the first row of bitcells of the pair 303, 304 are coupled to each other at a terminal CG2, which is coupled to the row logic 315 via a connector 314; erase gates of the bitcells of the pair 303, 304 are coupled to each other at a terminal EG2, which is coupled to the row logic 315 via a connector 316; common sources of the bitcells of the pair 303, 304 are coupled to each other at a terminal CS2, which is coupled to the row logic 315 via a wire 317; the other set of control gates of a second row bitcells of the pair 303, 304 are coupled to each other at a terminal CG2', which is coupled to the row logic 215 via a connector 318; the other set of wordlines of the second row bitcells of the pair 303, 304 are coupled to each other at a terminal WL2', which is coupled to the row logic 315 via a connector 319.

The bitcell array 305 may be grouped or otherwise arranged in bitcell blocks (not expressly shown in FIG. 3), and a bitcell block is often the minimum unit for erase operation in some examples. A bitcell erase operation, in some implementations, may therefore be configured as a mass operation, in that all the bitcells of the selected block(s) may receive the erase pulses and go through erase operation together. In some examples, the blocks within bitcell array 305 may be integrated within one or more integrated circuits, as noted previously, where additional and/or external circuitry may be utilized as well. The digital controller 330, in some examples, may comprise a processing unit (not expressly shown in FIG. 3), and storage (e.g., RAM (random-access memory), ROM (read-only memory)), which may include any suitable type of non-transitory computer-readable medium storing machine-executable instructions. The machine-executable instructions, when executed by the processing unit, cause the processing unit to perform one or more of the actions attributed herein to the digital controller 330.

The charge pump 325 may be configured to generate the different bias voltages applied to the bitcell array 305 during the bitcell operations referred to hereinabove. Accordingly, in general, the charge pump 225 may be operable as a voltage source. A charge pump may include a DC-to-DC converter that uses capacitors for energetic charge storage, and may provide an output voltage that is higher than an input voltage. While a charge pump may have particular utility in the illustrated example, other types of voltage source that do not rely on charge pumping may be used in some other examples. For the example depicted in FIG. 3, the charge pump 325 may be configured to generate the bias voltage(s) used by row and column logic 315, 310, respectively, to provide appropriate voltage bias to the bitcell array 305. The charge pump 325, in some examples, may be configured to receive control signals from the digital controller 330 that control the bias voltages generated by the charge pump 325. The voltages generated by the charge pump 325 may be adjusted or controlled based upon the bitcell operations performed and may depend on the different technology nodes used for fabricating the IC portion 300. As indicated above, bitcell operations can include read operations, program operations, erase operations, and/or other desired bitcell operations with respect to one or more bitcells or blocks of bitcelles of the bitcell array 305. Further, the charge pump 325 may be implemented as a single circuit block or as multiple circuit blocks distributed in different locations throughout within an IC including the bitcell array 305.

As noted hereinabove, fabricating Flash memory bitcells along with various non-Flash circuit portions within an IC, including the various aforementioned peripheral circuits, remains fraught with several challenges as the advanced technology nodes continue to scale. Examples set forth herein provide a Flash First fabrication scheme for fabricating the Flash memory portion of an IC in a first or initial stage of the flow such that the bitcells are formed in a substantially completed form before commencing the fabrication of CMOS logic circuits on the same IC die, as will be described in detail below.

Figure 4A:
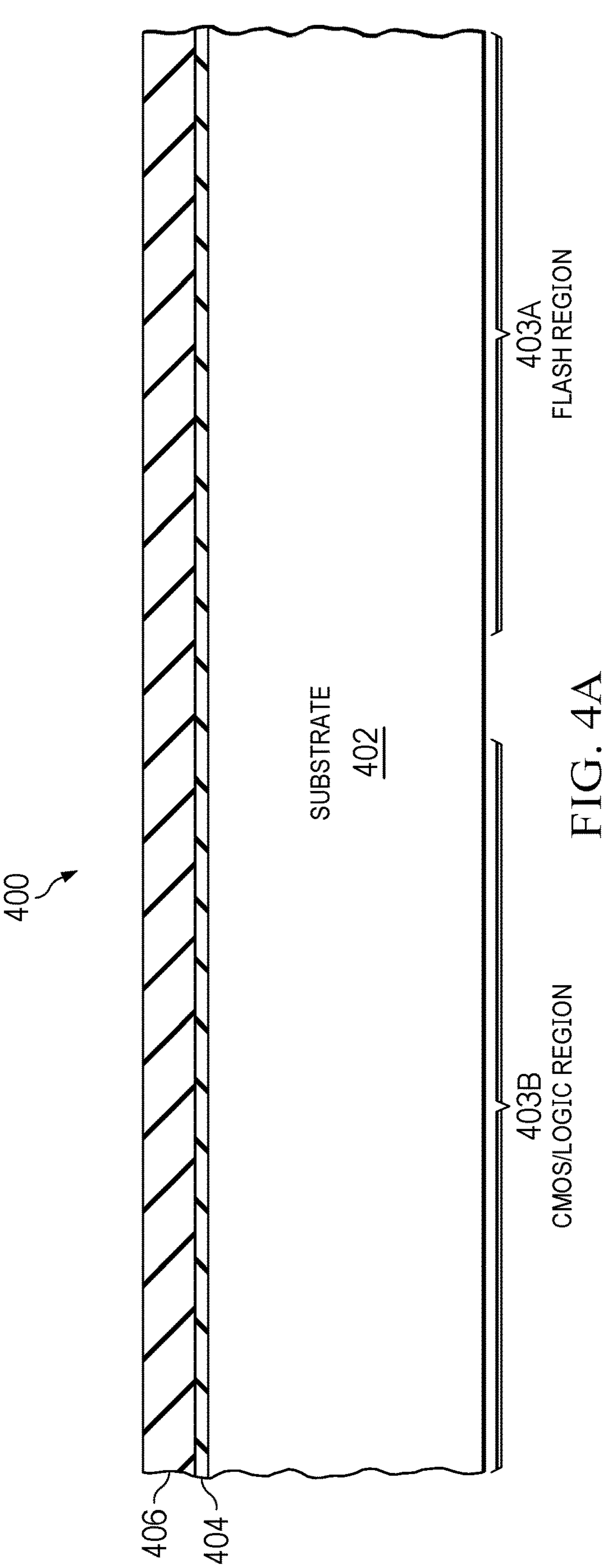
FIGS. 4A-4V depict cross-sectional views of various stages of a process flow for fabricating an IC having embedded Flash memory and CMOS logic circuitry according to some examples of the present disclosure.
Figure 4B:
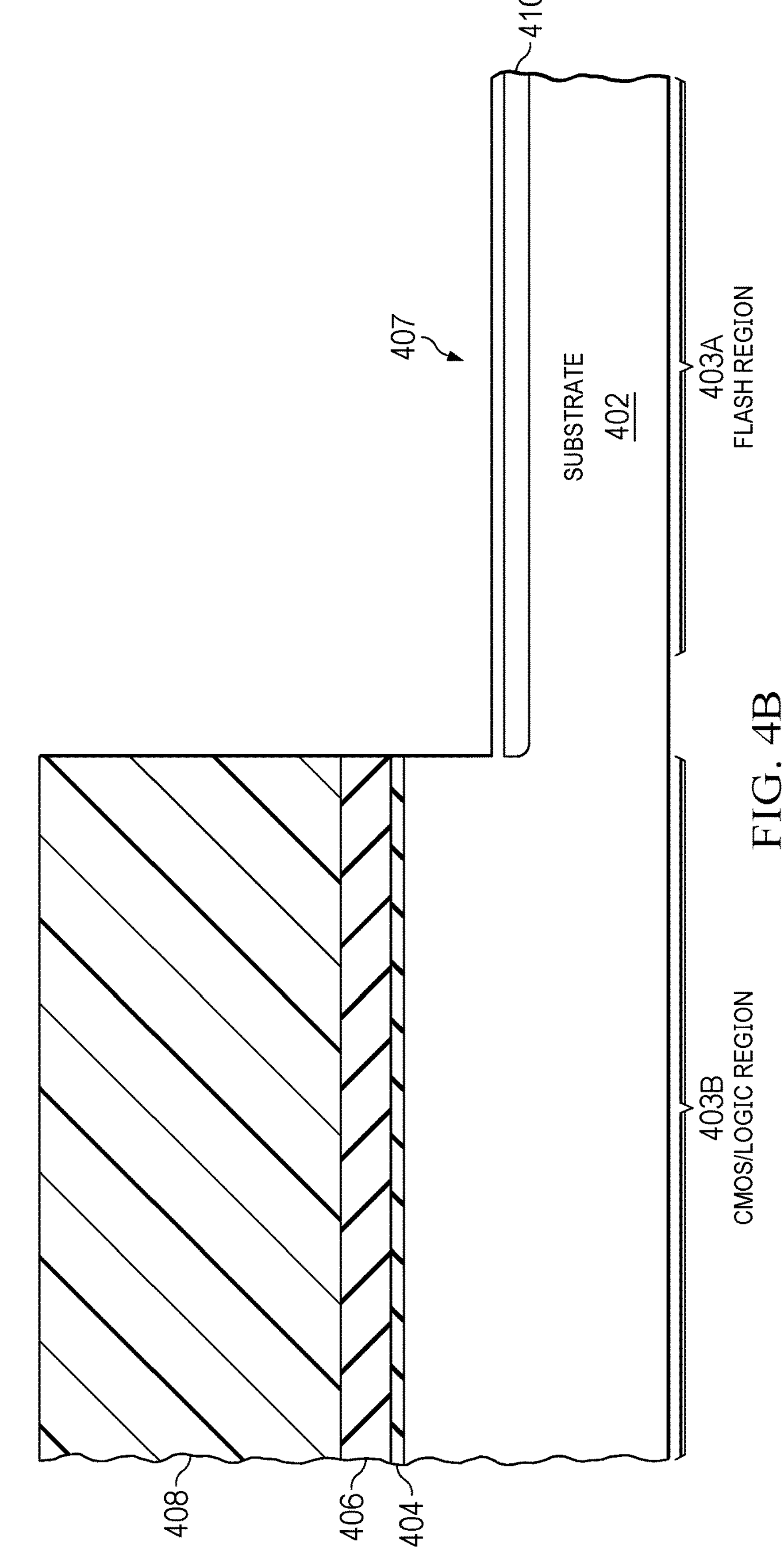
Figure 4C:
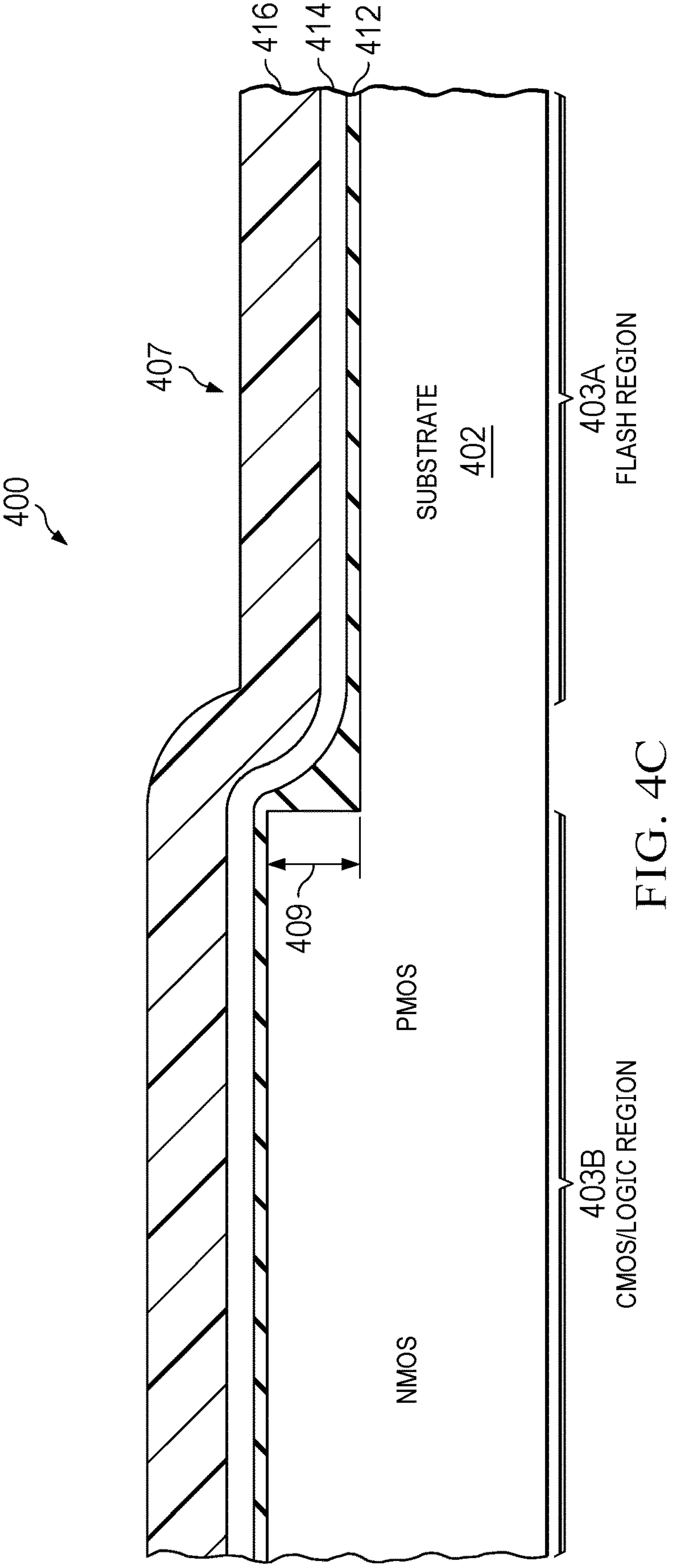
Figure 4D:
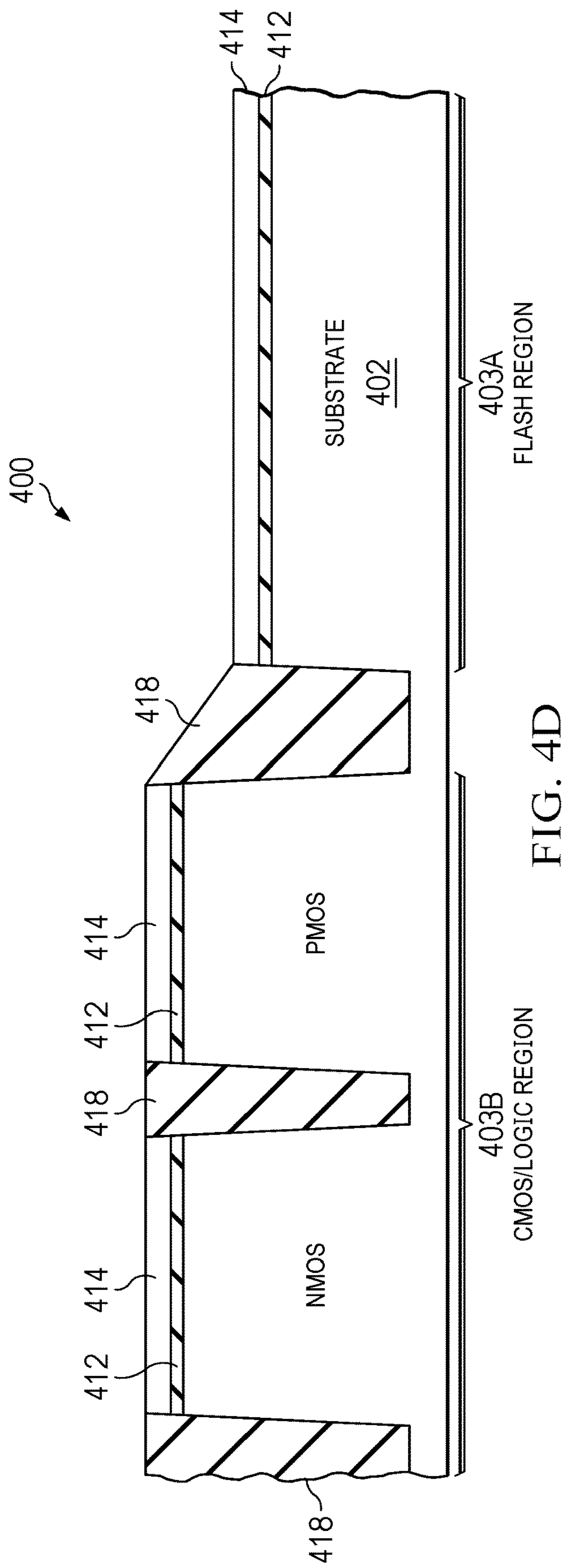
Figure 4E:
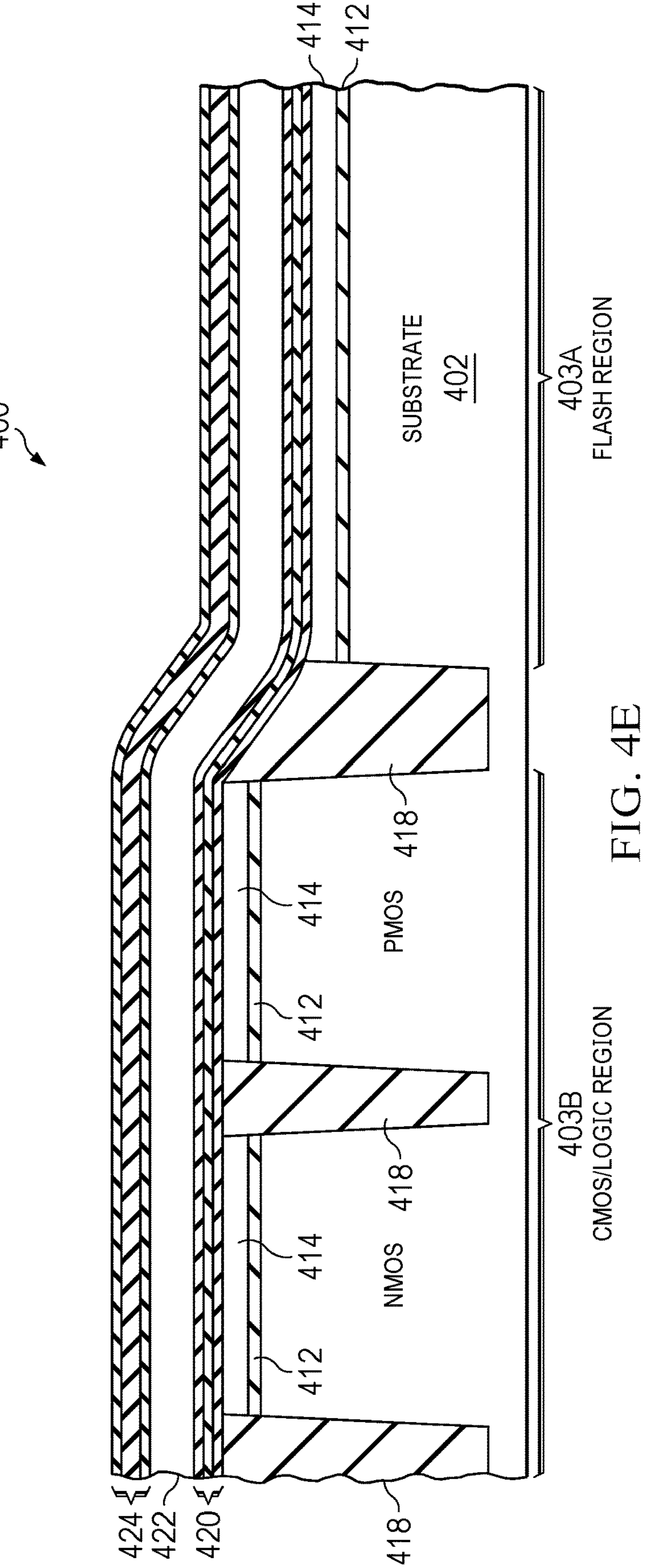
Figure 4F:
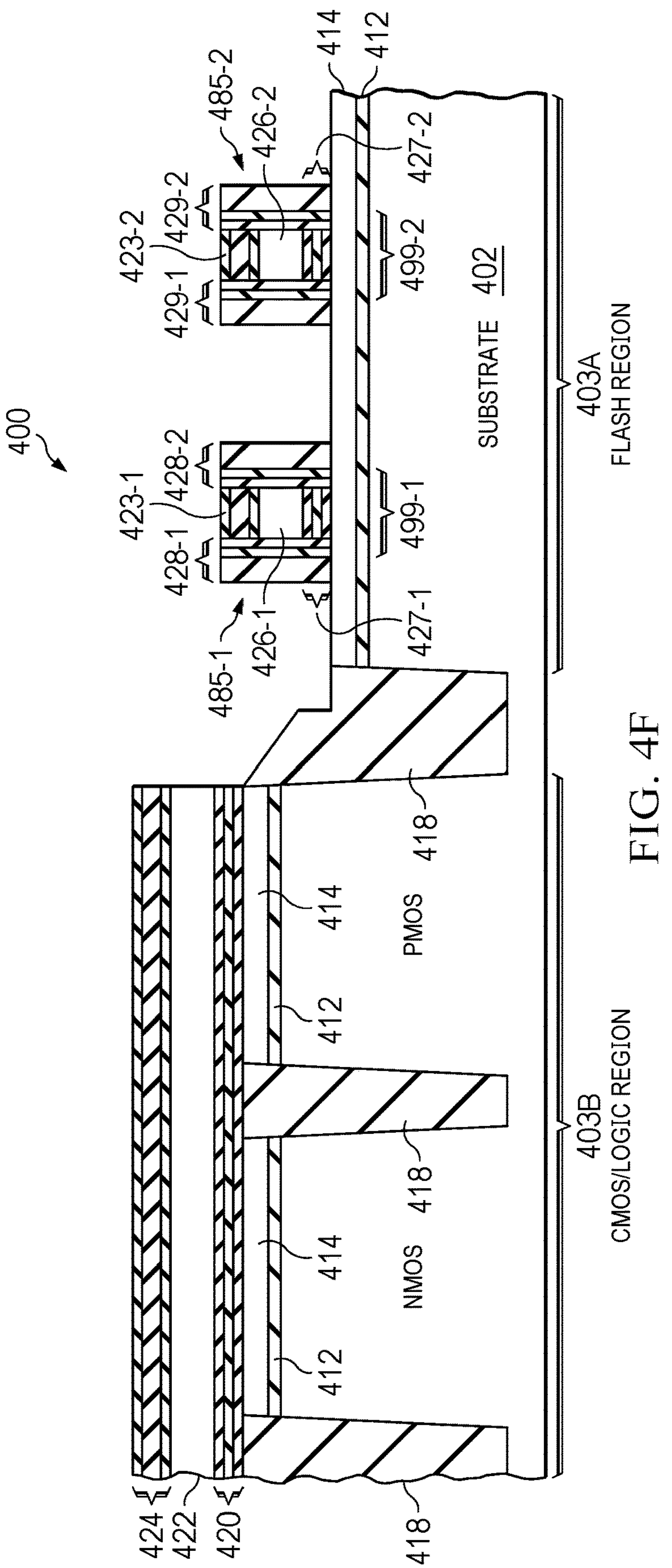
Figure 4G:
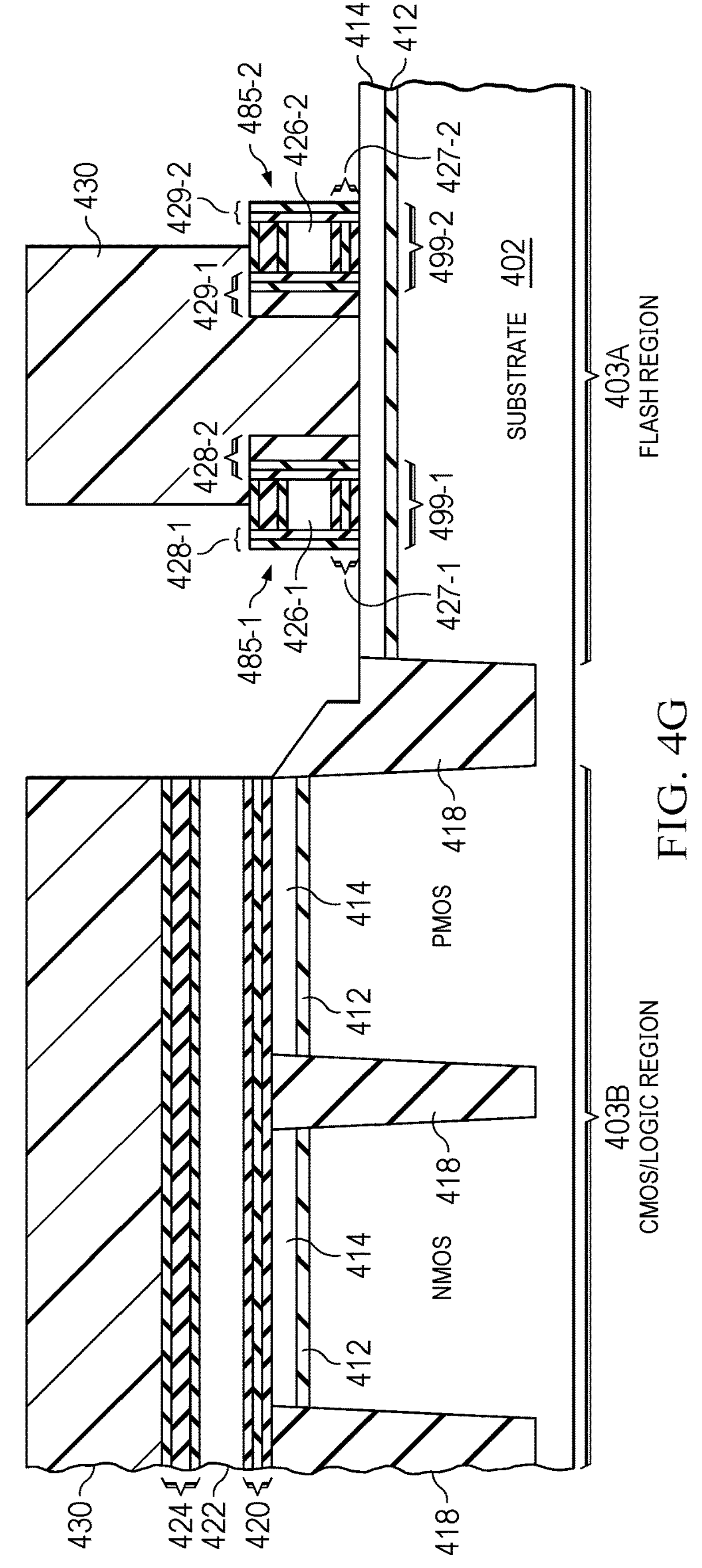
Figure 4H:
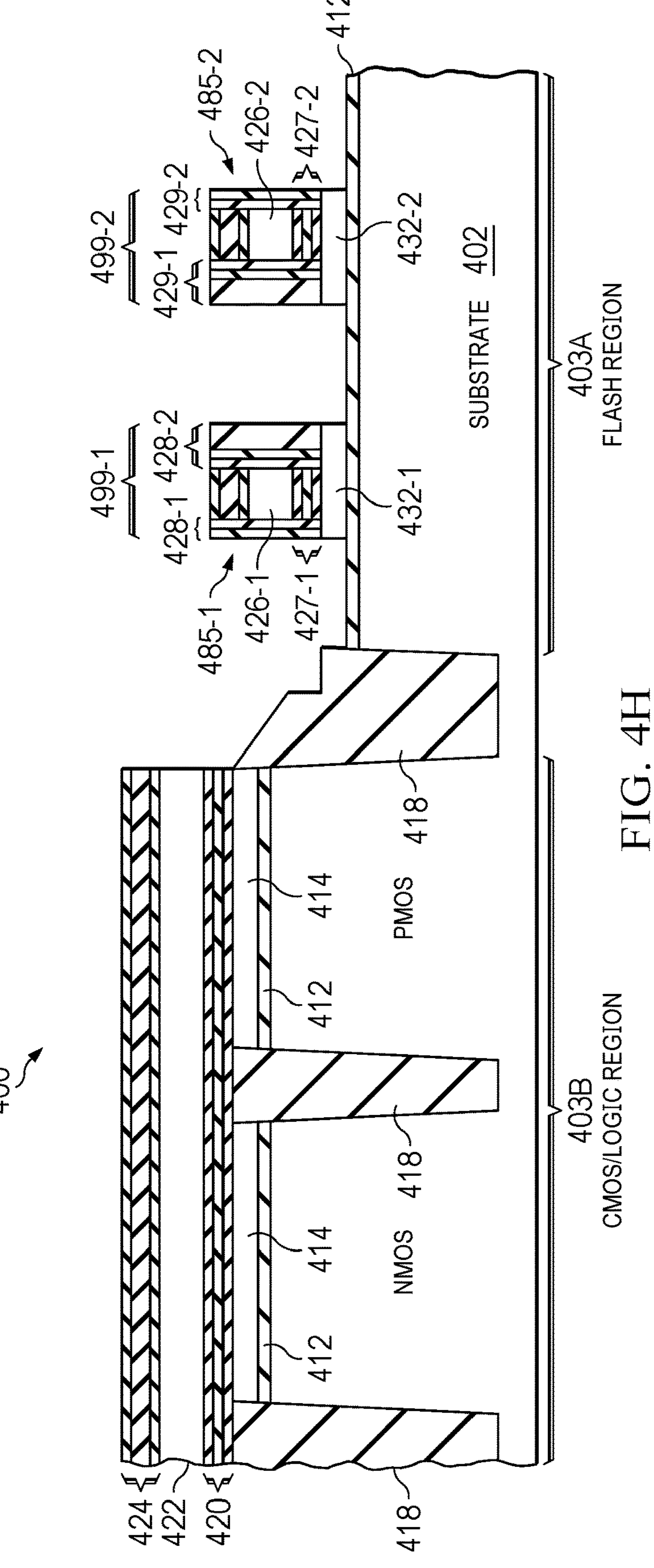
Figure 4I:
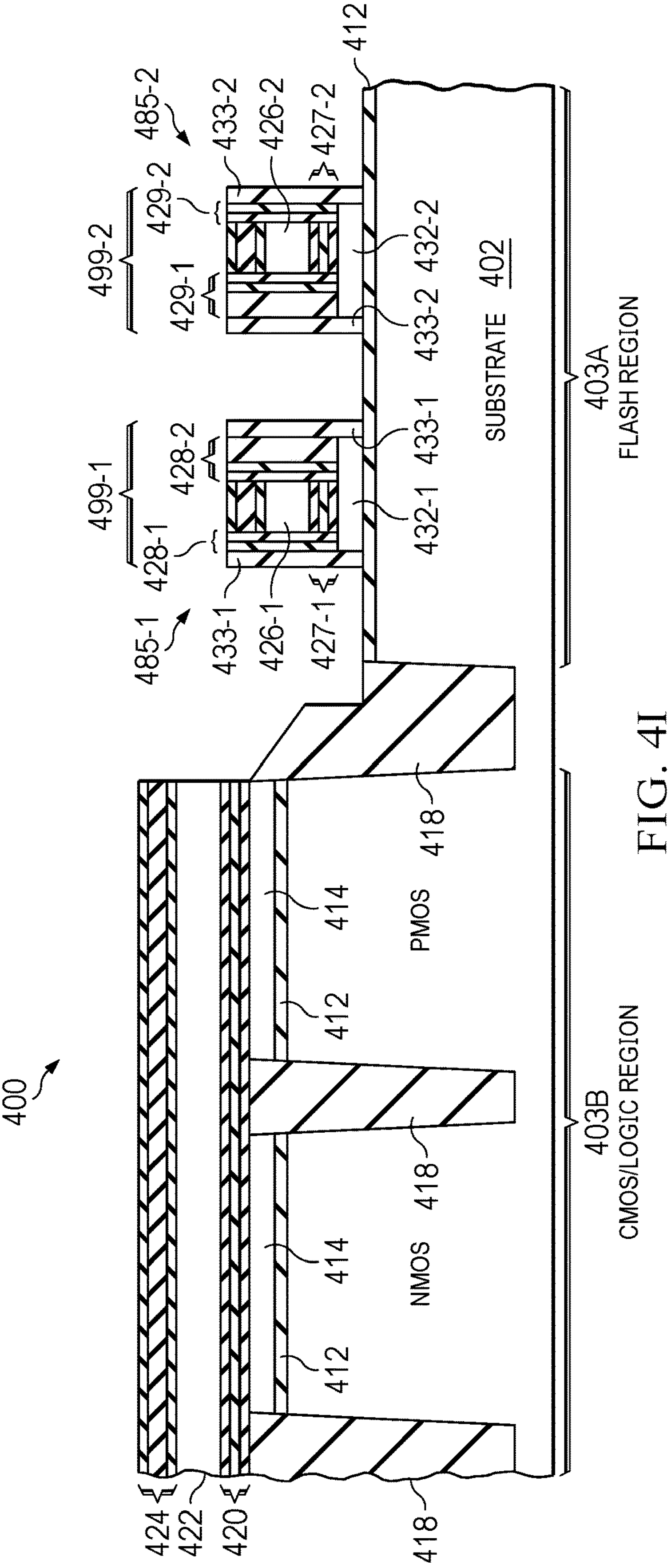
Figure 4J:
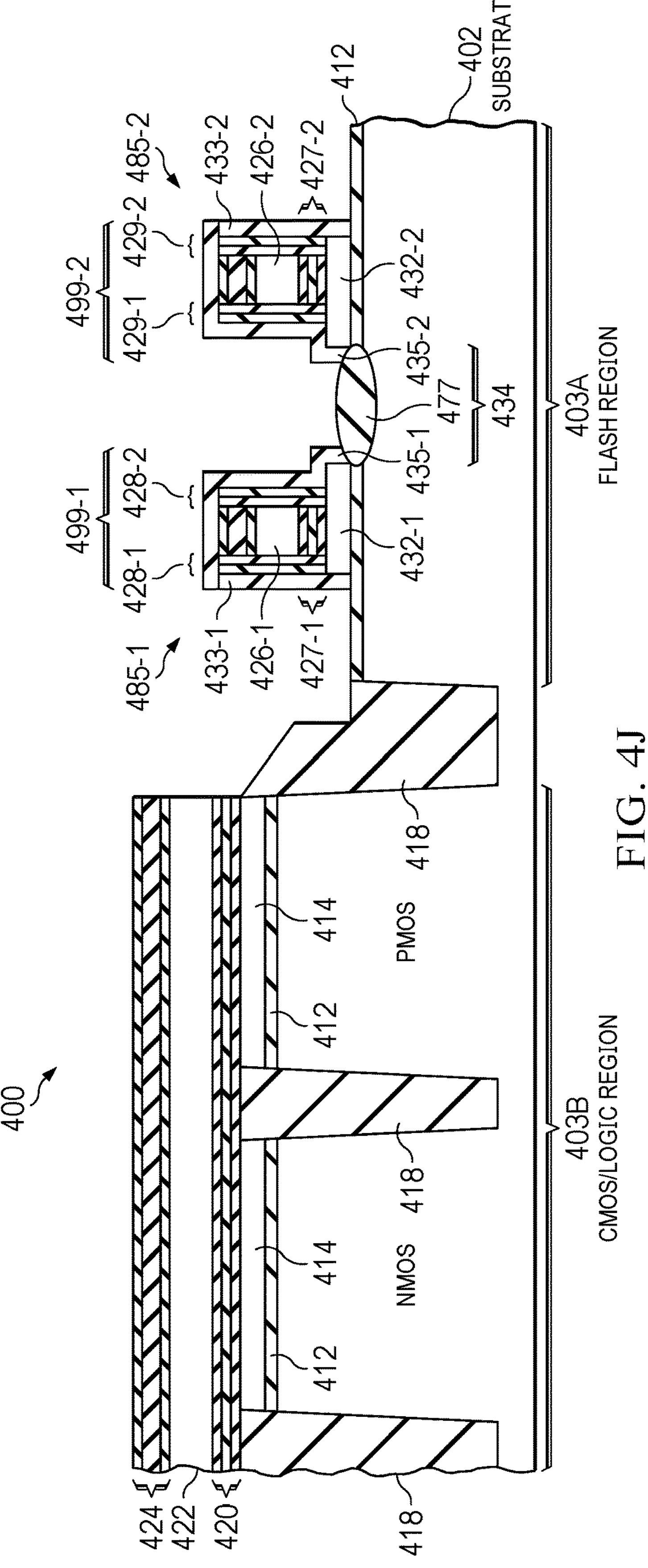
Figure 4K:
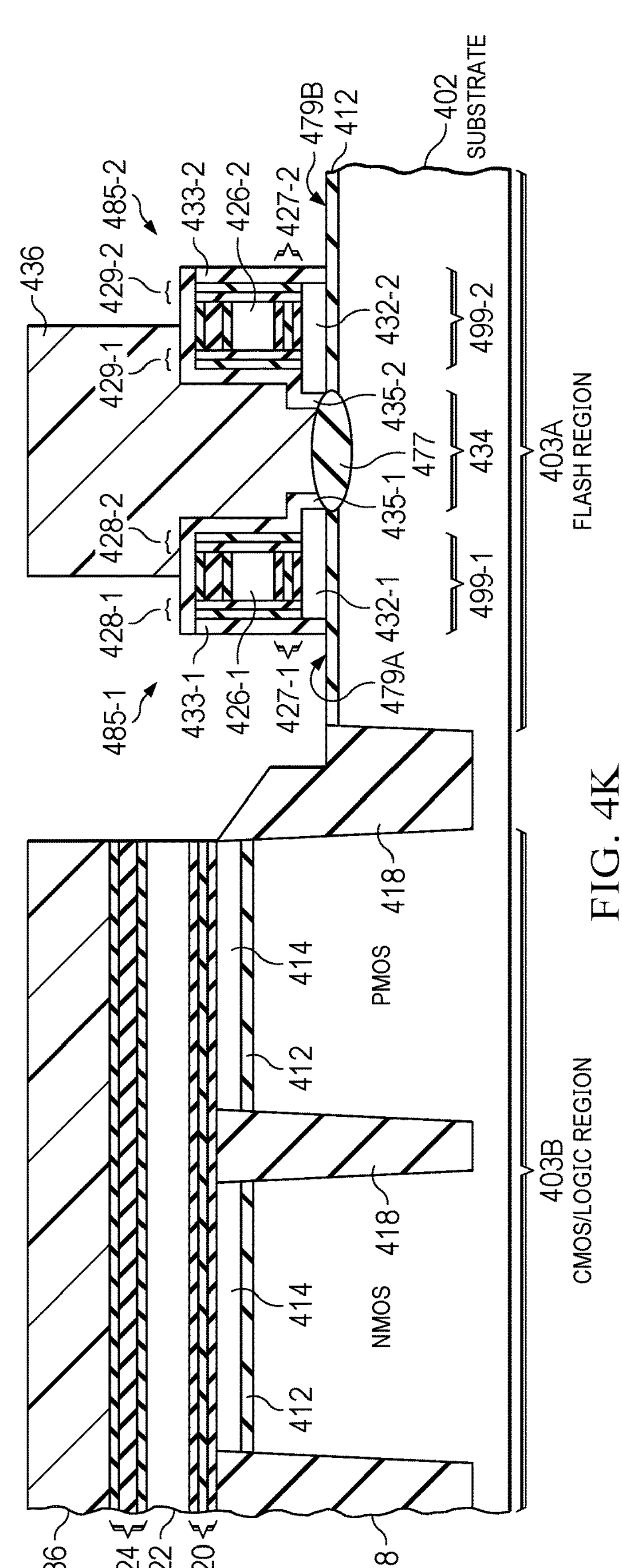
Figure 4L:
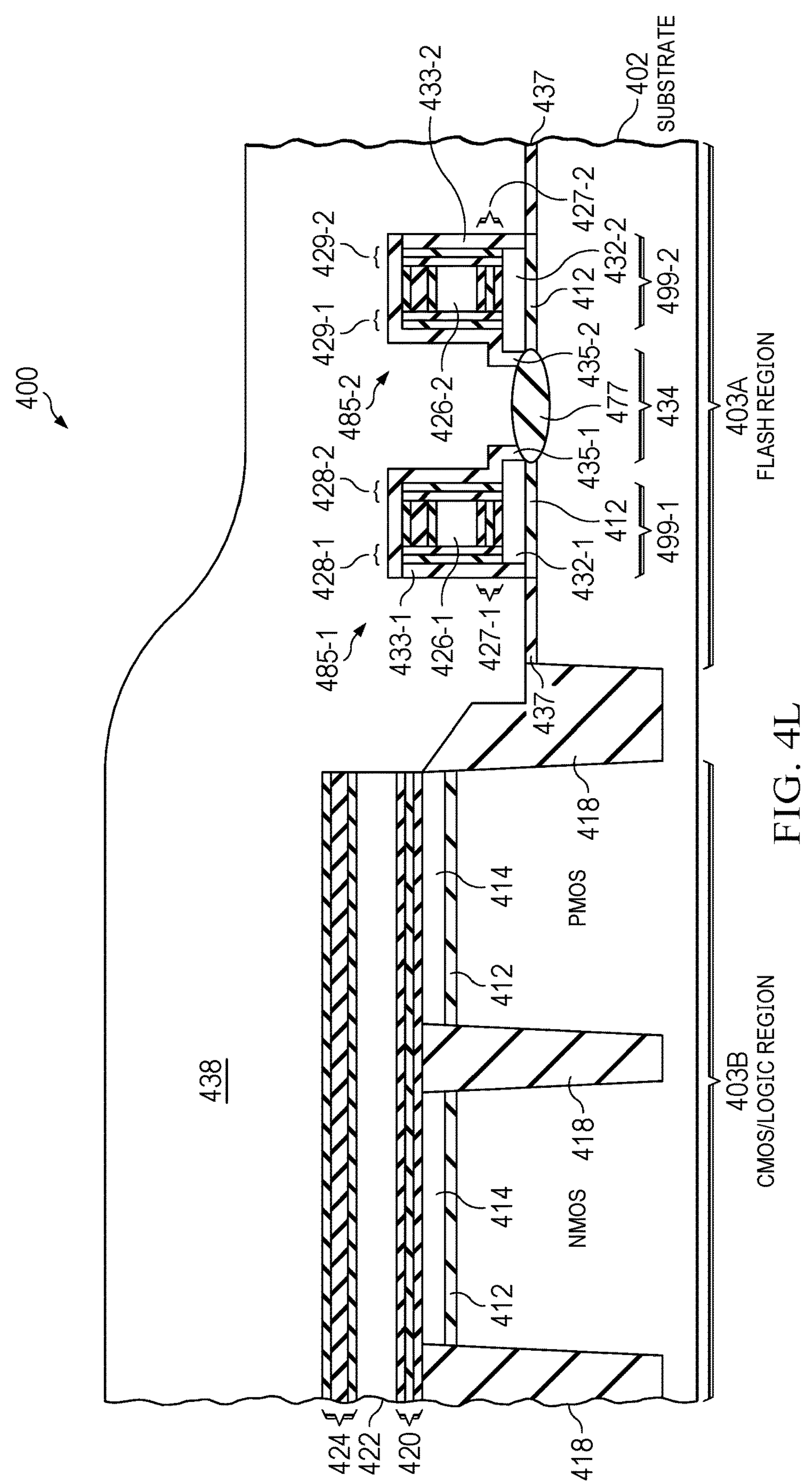
Figure 4M:
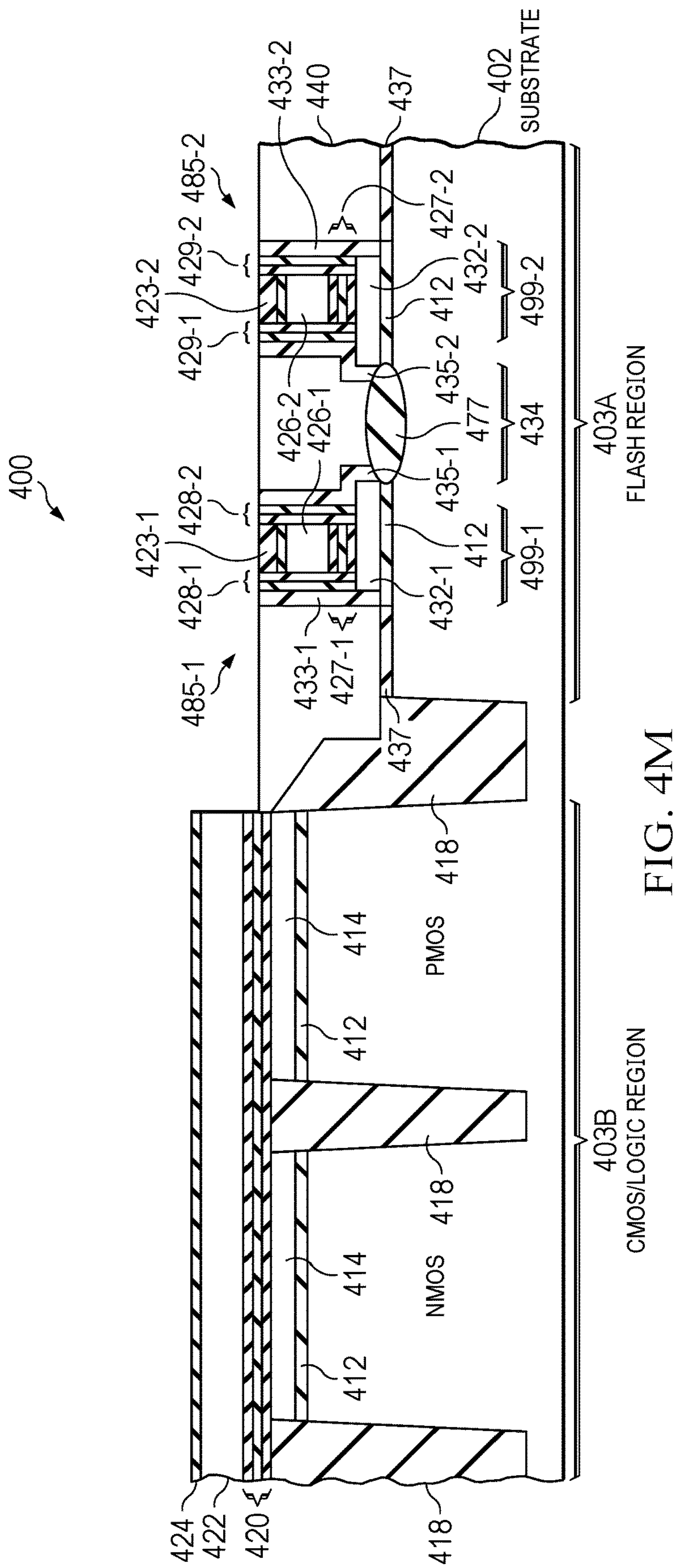
Figure 4N:
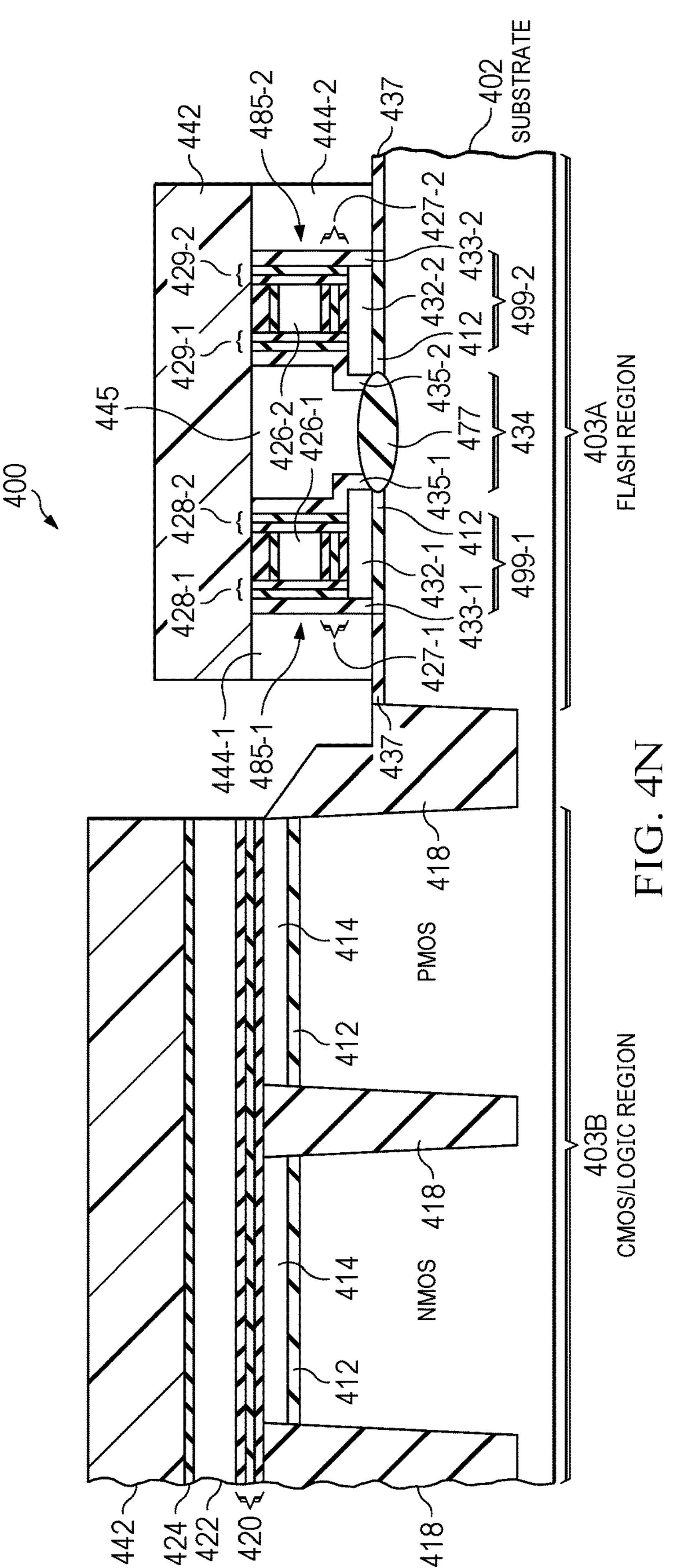
Figure 4O:
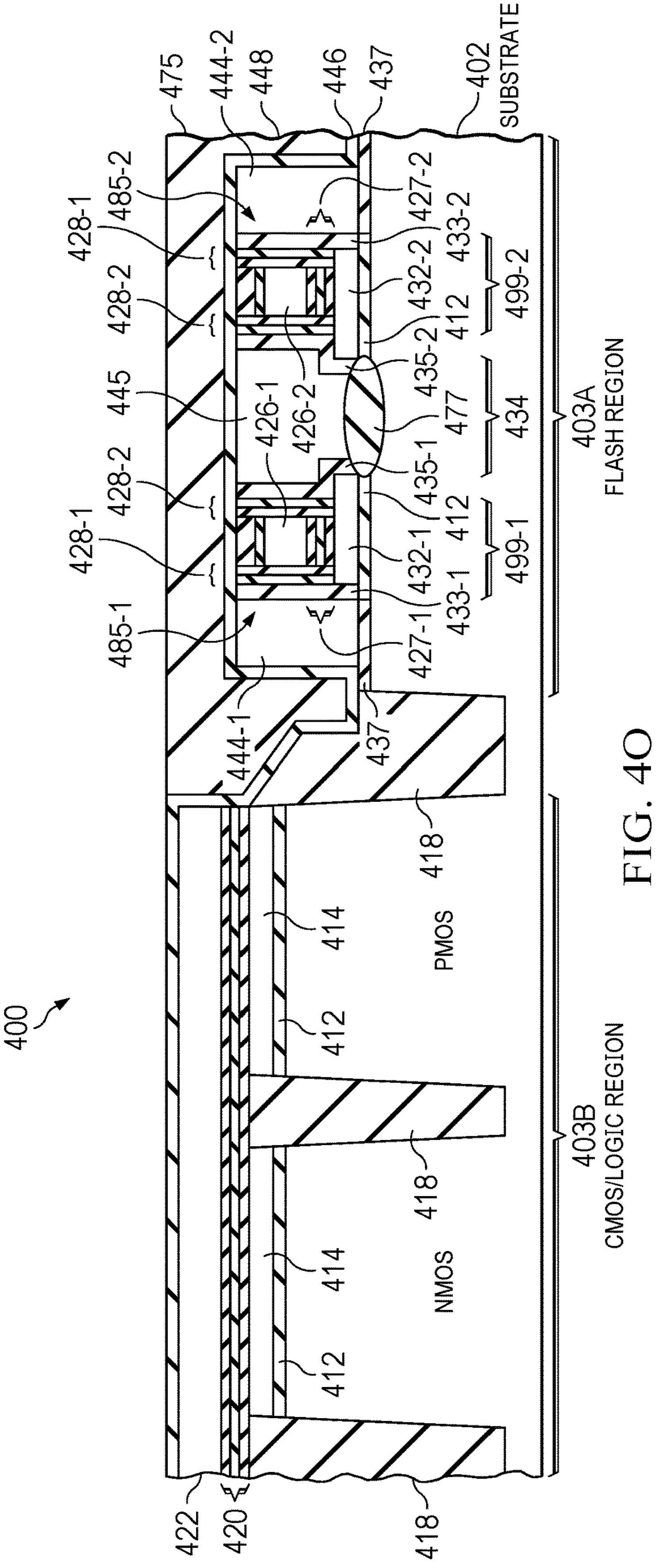
Figure 4P:
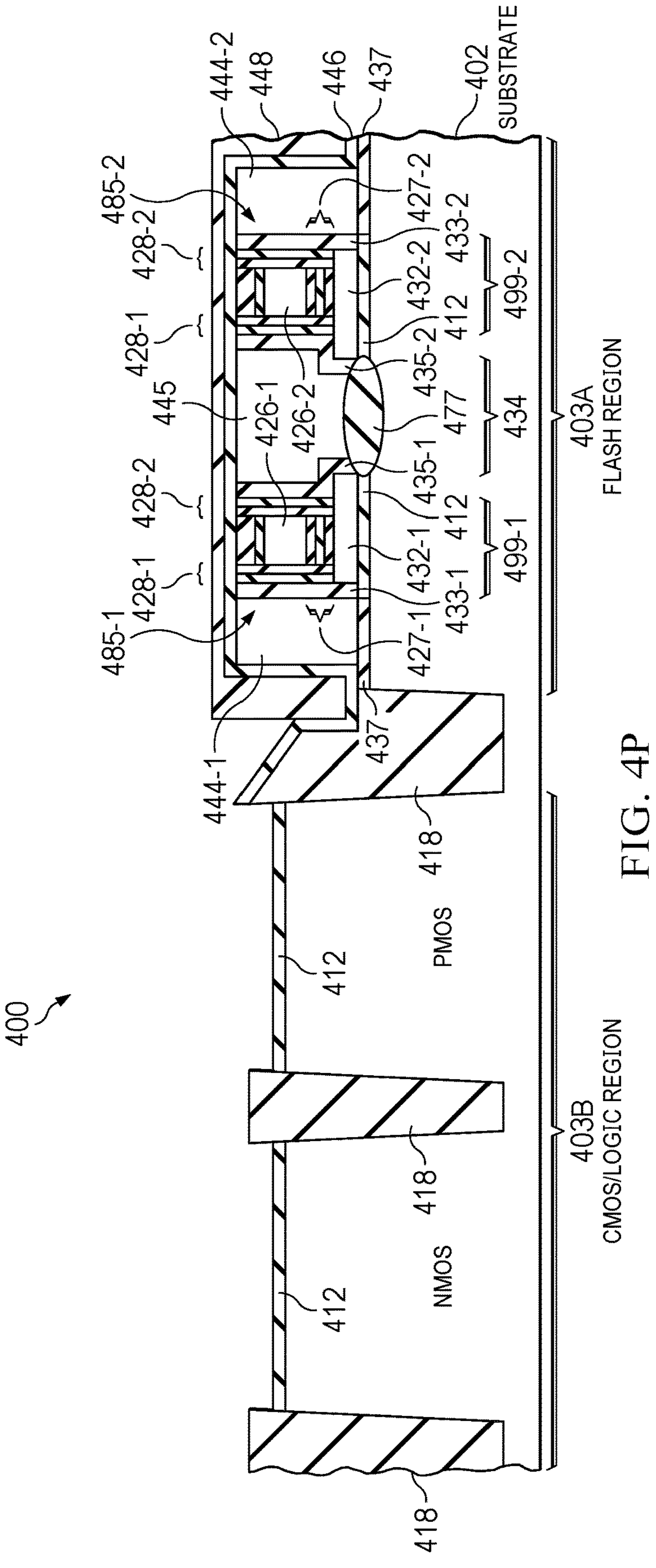
Figure 4Q:
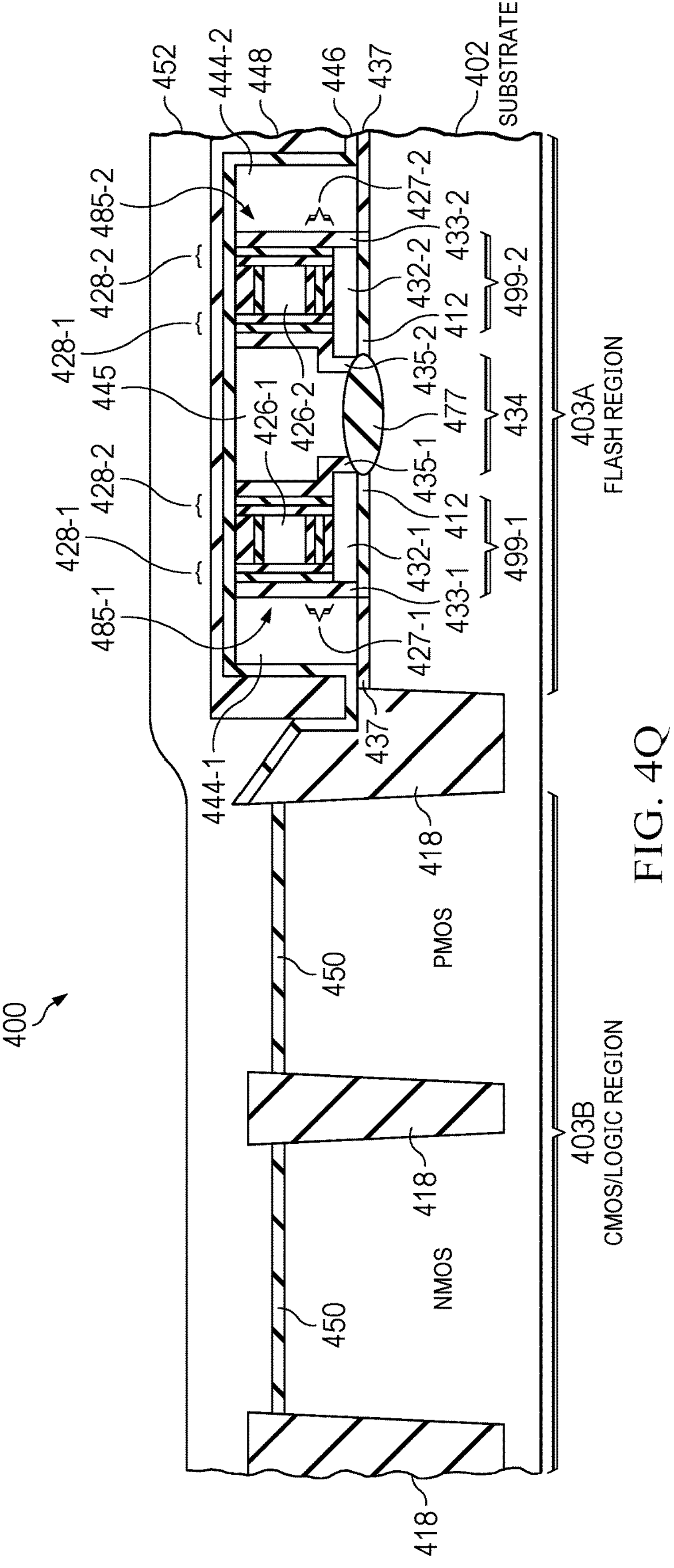
Figure 4R:
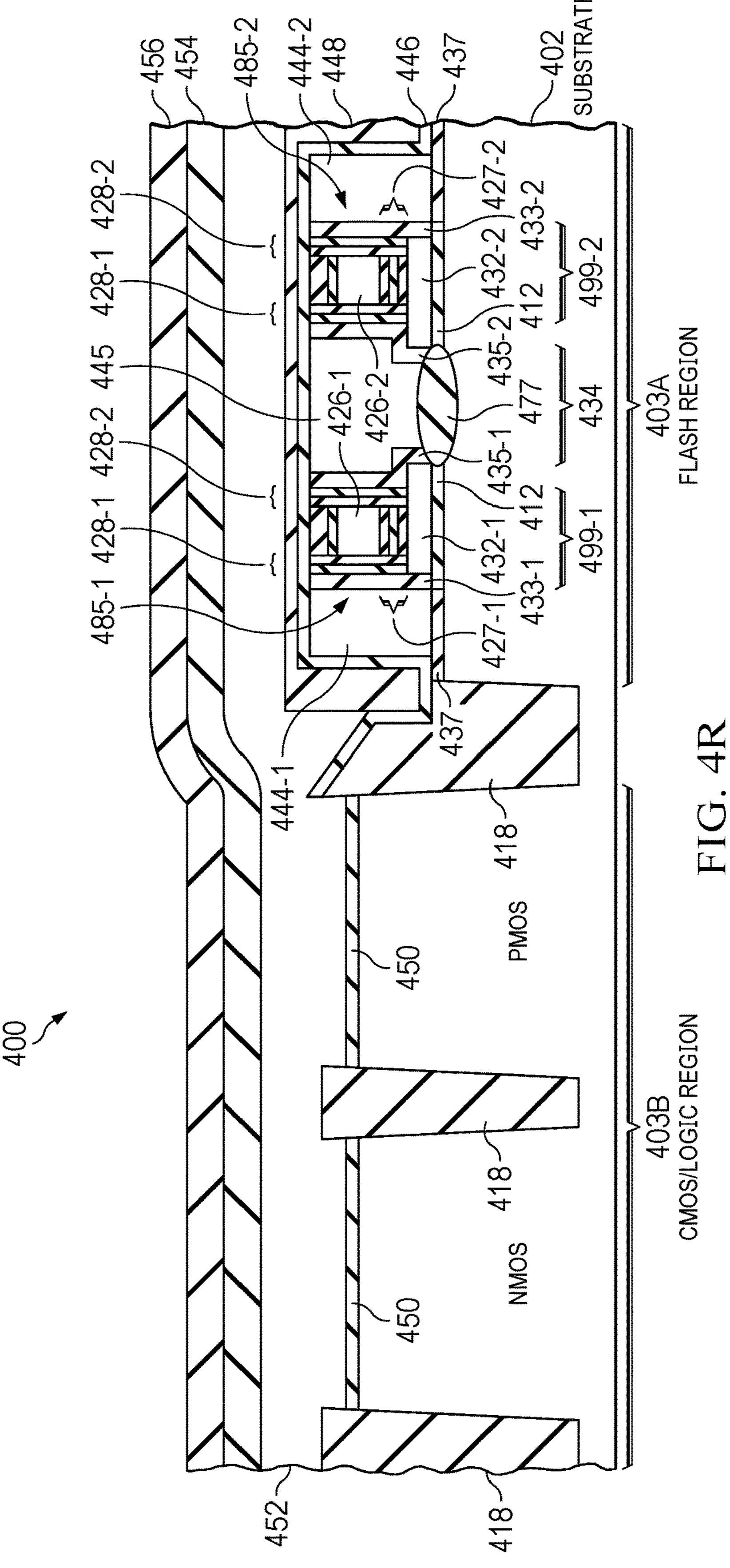
Figure 4S:
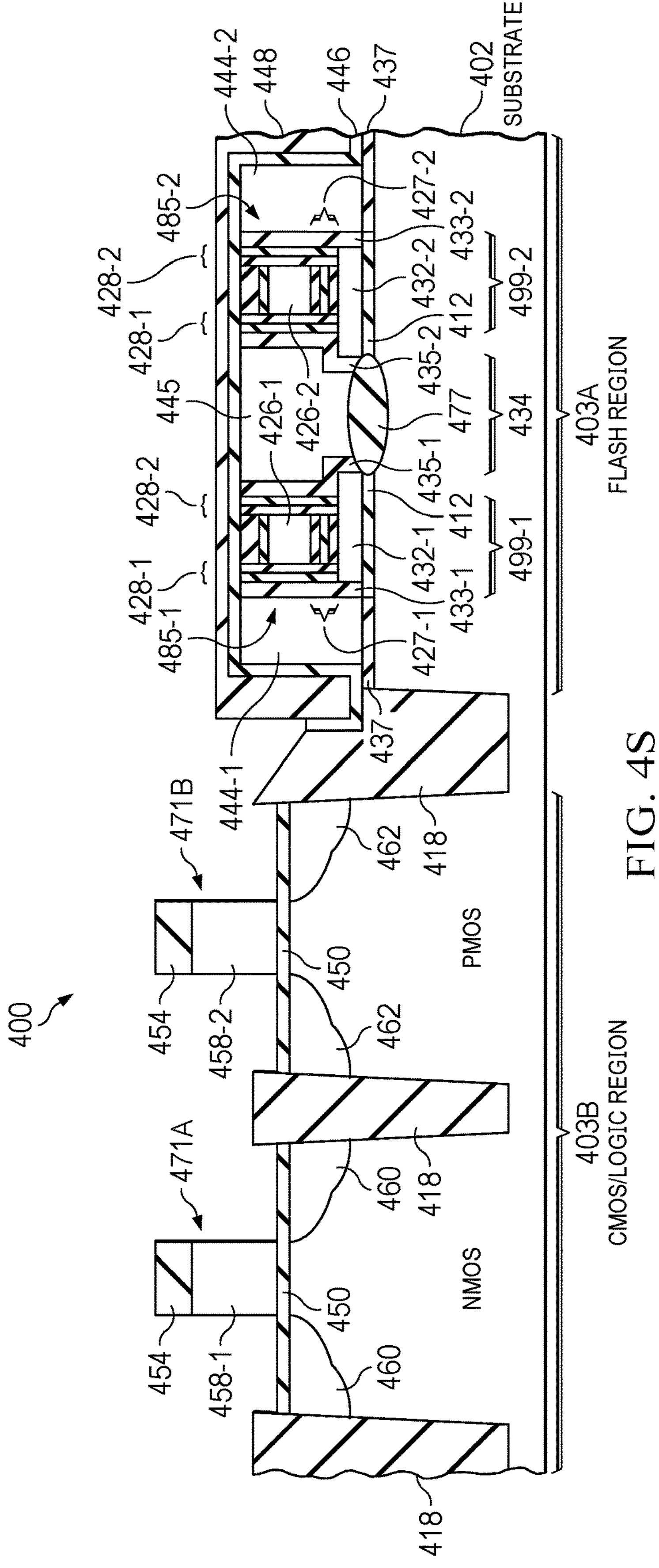
Figure 4T:
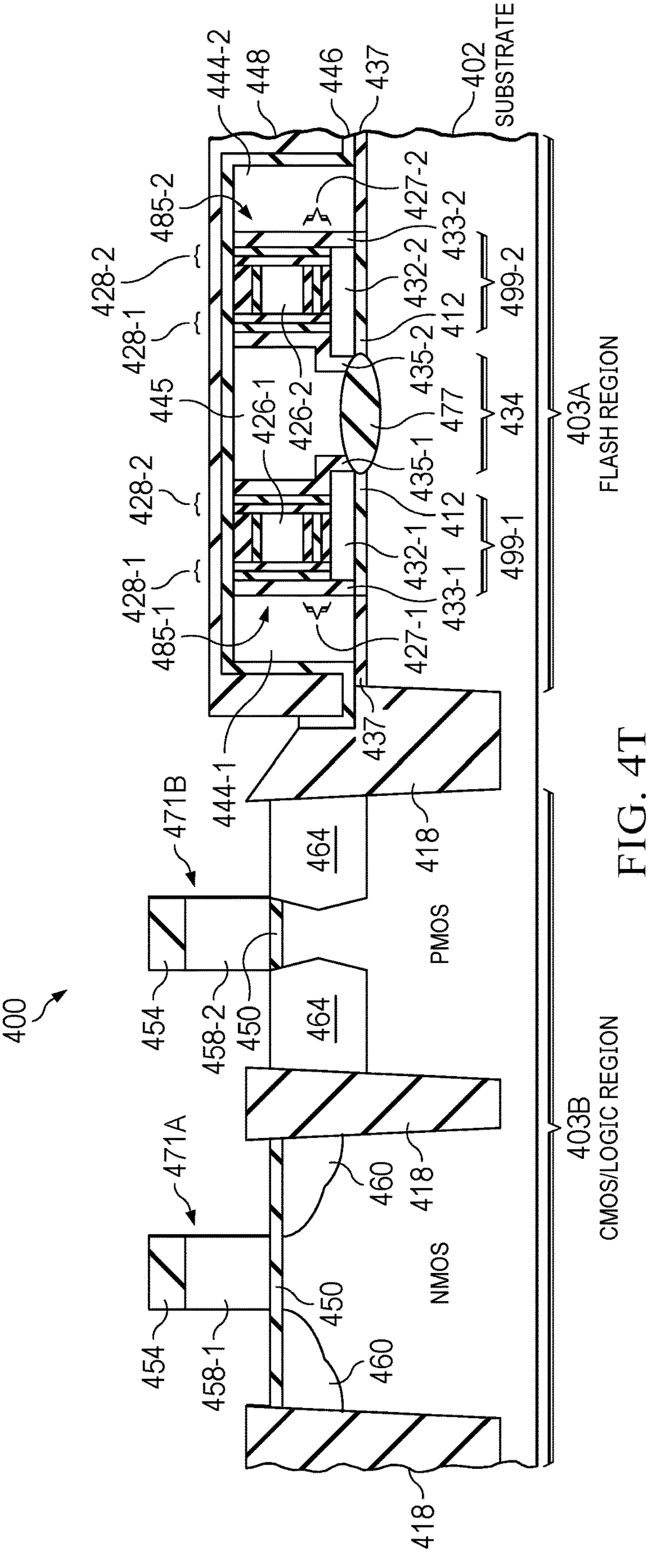
Figure 4U:
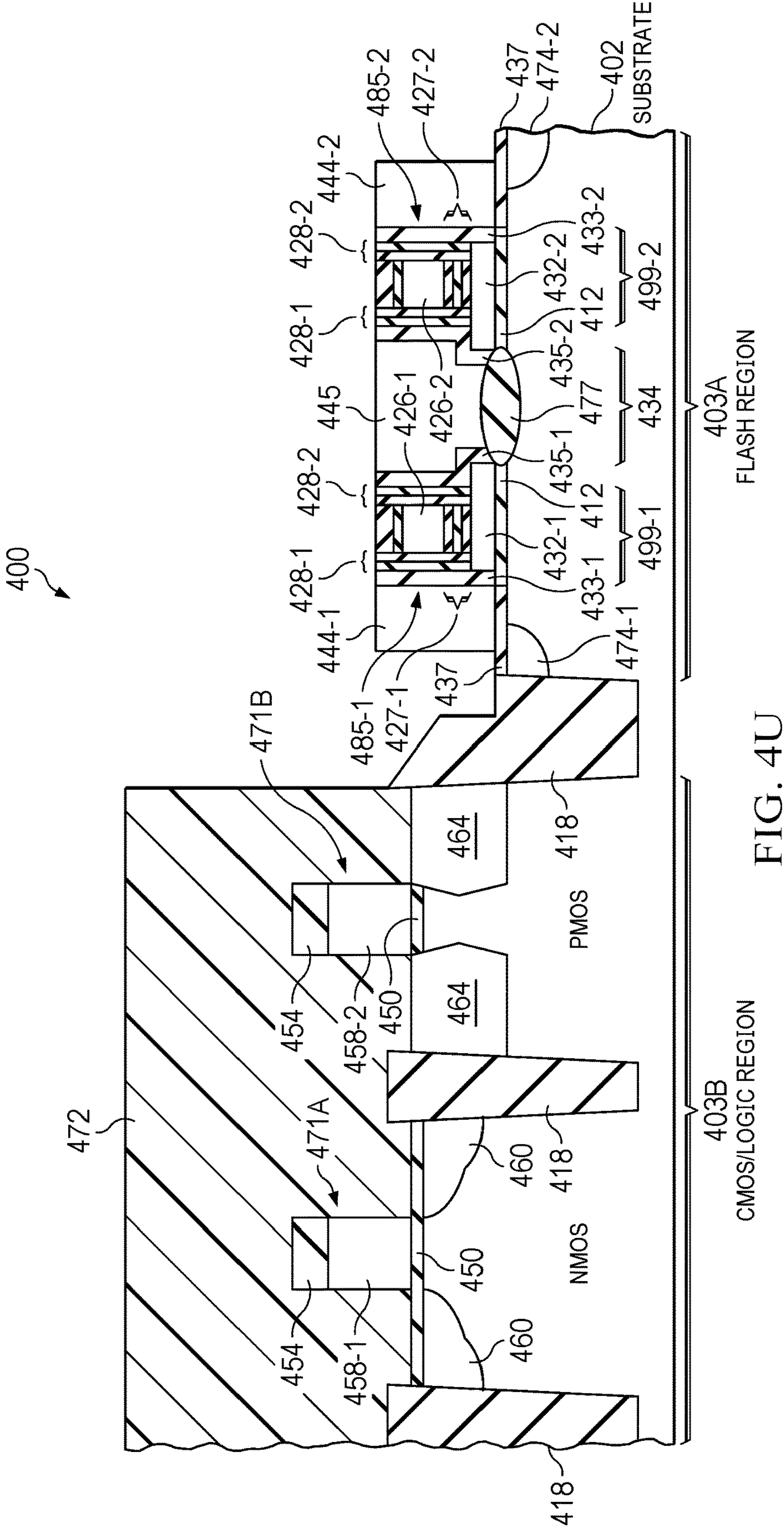
Figure 4V:
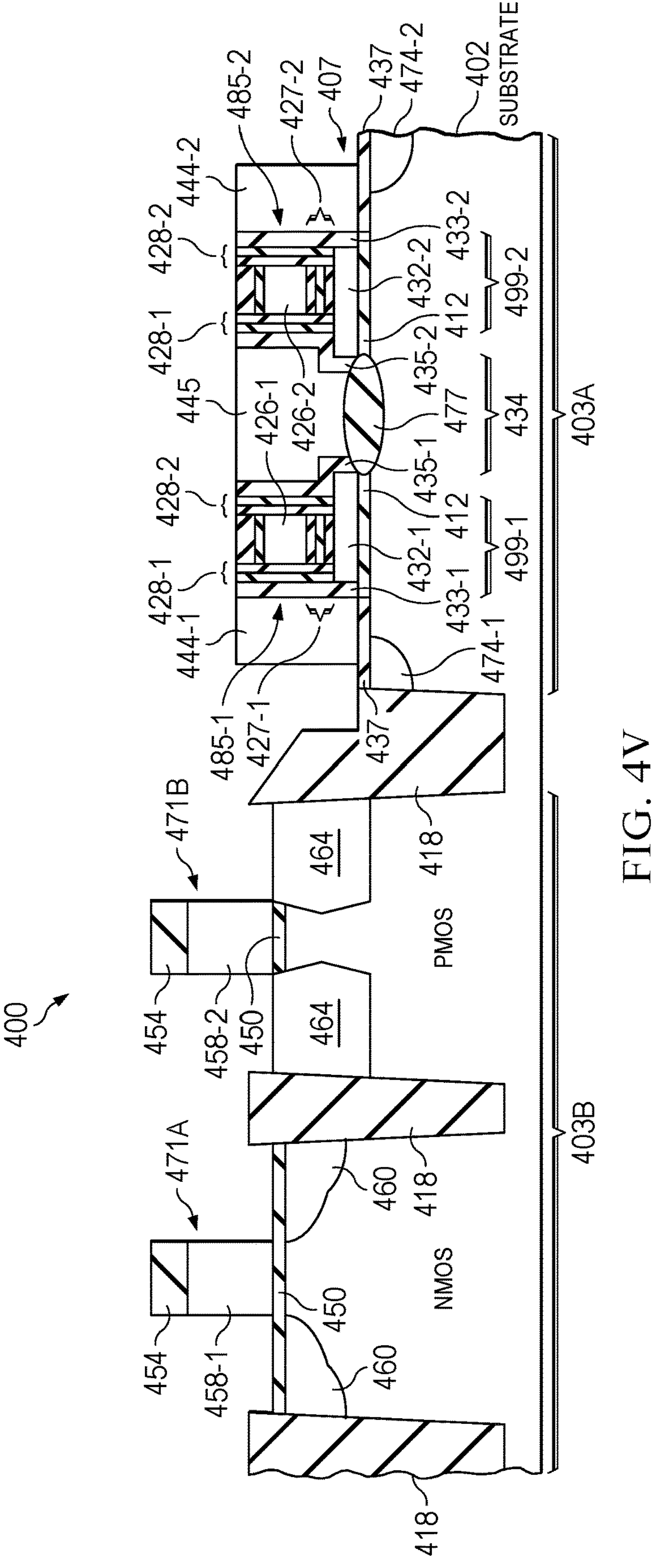

FIGS. 4A-4V depict cross-sectional views of process stages for fabricating an IC device including Flash memory and CMOS logic circuitry according to some examples of the present disclosure. In these Figures, reference number 400 generally refers to a partially formed IC device 400 fabricated in a semiconductor die or a portion thereof provided as part of a suitable semiconductor wafer, where a substrate 402 may include a first region or area 403A (which may be an example of or include aspects of the area 102A) for forming Flash memory cells in a recessed area therein and a second region or area 403B (which may be an example of or include aspects of the area 102B) for forming various other circuits, including memory peripheral circuits, logic circuits, processor circuits, etc., collectively referred to as CMOS logic circuitry, as noted previously in reference to the example depicted in FIG. 1. Although numerous examples of CMOS logic circuitry have been described in reference to FIG. 1, the fabrication of an IC according to the teachings herein may involve any combination or sub-combination of such example circuits, without necessarily being limited thereto or requiring any particular Flash memory array arrangement, embedded or otherwise. For instance, an IC device according to the teachings herein may comprise a standalone Flash memory device having peripheral circuitry formed in a non-recessed substrate area, e.g., region 403B, in some arrangements. Further, various CMOS logic circuits may comprise transistors operable at different operational voltages depending on implementation, application, and/or technology note involved, where example operational voltages may comprise 1.0V, 1.5V, 3.3V, 5.0V, etc., without limitation, and the transistors may be disposed in different voltage domains of the circuitry, e.g., low voltage (LV) domains, high voltage (HV) domains, and the like.

FIG. 4A depicts the IC device 400 in an early fabrication stage where a pad oxide layer 404 of suitable thickness is formed over the substrate 402. Thereafter, a nitride layer 406 of suitable thickness is formed over the pad oxide layer 404 in preparation for a photolithography and etch stage configured to define a recessed area in the first region 403A, also referred to herein as Flash region, of the substrate 402. In one arrangement, a total thickness of the pad oxide layer 404 and the nitride layer 406 may be about 300 Å to 2000 Å, without limitation. The formation of various layers such as the pad oxide layer 404 and nitride layer 406 as well as other dielectric layers, conductive layers, non-conductive layers, etc., set forth herein may be performed using a variety of techniques, materials and in different thicknesses. The substrate 402 may predominantly comprise suitably doped silicon in some examples, although other semiconductor materials such as, Ge, GaAs, SiC, GaN, other Group III-V materials, etc., may be used in some implementations, where one or more epitaxial layers or single-crystal layers may be formed or provided in certain areas of the substrate 402 in some arrangements.

FIG. 4B depicts a patterned photomask 408 formed over the nitride layer 406 for defining a recessed area 407 in the Flash region 403A while covering the second region 403B (referred to as CMOS/Logic region) of the substrate 402. FIG. 4B also depicts the recessed area 407 that has been formed. Depending on implementation, suitable etch process(es) may be deployed for removing the mask material, nitride material and pad oxide material uncovered by the patterned photomask 408. Subsequently, an implant process may be performed in the Flash region 403A with the patterned photomask 408 in place. In some examples, the implant process may include an anti-punch-through implant or well implant for the transistors associated with the bitcells. By way of illustration, a doped layer 410 may be formed by implanting dopants (e.g., boron) in the Flash region 403A.

In some examples, subsequent processing may involve removal of the photomask layer 408 from the CMOS/Logic region 403B and oxidation of the exposed substrate in the Flash region 403A (which may be referred to as a local oxidation of silicon (LOCOS) process) such that the recessed area 407 can be formed as a result of consuming a portion of the exposed substrate during the oxidation. The LOCOS process and suitable wet stripping of the grown oxide creates the recessed area 407. In other examples, an etch process (e.g., dry etch process) may be performed to remove a portion of the exposed substrate in the Flash area 403A followed by an oxidation step. In such examples, the oxidation step subsequent to the etch step may be configured to clean and condition the surface of the substrate material in the recessed area 407 so that any dislocations and/or impurities that might have been caused by the recess etch process may be removed from the recessed area 407. In this manner (LOCOS process or etch process), a "pristine" surface may be provided for the formation of Flash bitcells in the recessed area 407.

Although a single Flash region 403A and a single CMOS logic region 403B are exemplified herein, there is no specific requirement or limitation as to the number of Flash regions and/or CMOS logic regions, or as to the number of recessed areas in a Flash region. Accordingly, for purposes of some examples, the terminology referring to an area of the substrate where Flash memory cells are fabricated, e.g., phrases such as "Flash region", "first region", "first area", "recess", or "recessed area" may be treated roughly synonymously depending on the context unless otherwise expressly noted. Likewise, the phrases such as "CMOS Logic region", "second region", "second area", or "non-recessed area" may be treated roughly synonymously for referring to an area of the substrate dedicated to the fabrication of CMOS logic devices, unless otherwise expressly noted or construed depending on the context. Moreover, FIG. 4B (and FIGS. 4C-4V) includes a schematic illustration of a transition region between the Flash region 403A and the CMOS logic region 403B so as to juxtapose the two regions side-by-side, details of the transition region depicted in FIG. 4B (and subsequent FIGS. 4C-4V) may deviate from actual structural configurations of the transition region, which may vary based on details of integration schemes for fabricating Flash memory and CMOS logic circuitry.

Referring to FIG. 4C, a floating gate (FG) oxide layer 412 (which may include aspects of the gate oxide 218A) and an FG layer 414 (which may include aspects of the floating gate 216A) comprising polysilicon may be formed over the substrate 402 after removing the nitride layer 406 and the pad oxide layer 404. The layers 412 and 414 may overlie the first and second regions 403A and 403B across a depth 409 of the recess 407, which creates the vertical topography as shown in FIG. 4C. In general, the depth 409 of the recess 407 may be variable depending upon implementation, e.g., about 800 Å to 1200 Å, without limitation. As described herein, the recess 407 may be devised to facilitate subsequent processing steps in spite of the difference in heights of the Flash memory and the CMOS logic circuitry—e.g., patterning of the logic polysilicon layer 452 described with reference to FIG. 4R.

Also, a hard mask layer 416 comprising oxide material may be formed over the FG layer 414. The hard mask layer 416 may facilitate forming the field isolation described below with reference to FIG. 4D. As will be seen further below, whereas respective portions of the FG oxide layer 412 and the FG layer 414 in the first region 403A may be processed as part of the Flash First fabrication flow for forming the floating gates and FG oxide components of the bitcells of a Flash array, the FG oxide layer and FG layer portions in the second region 403B may remain substantially unaltered until the formation of the bitcells in the first region 403A is completed, whereupon the FG oxide layer and the FG layer portions of the second region 403B may be removed before forming appropriate transistor devices for the desired CMOS logic circuitry in the second region 403B.

In an example implementation, the FG oxide layer 412 may be formed by a suitable process, e.g., deposited, oxidized or otherwise grown, and may have a thickness of about 50 Å to 150 Å, without limitation. In an example implementation, the polysilicon FG layer 414 may have a thickness of about 150 Å to 450 Å, without limitation.

Field isolation between the first and second regions 403A, 403B as well as active area definitions in respective locations in the first and second regions 403A, 403B may be provided by a shallow trench isolation (STI) process, as illustrated in FIG. 4D. The STI process involves forming STI structures 418 at appropriate locations in the substrate 402 with respect to PMOS and NMOS areas of the second region 403B. The STI structures formed in the first region 403A with respect to the Flash bitcells are not specifically shown in the cross-sectional view of FIG. 4D because the Flash STI structures may be formed along a direction (along the X-axis) that is parallel to the cutting plane (i.e., not orthogonal to the cutting plane of the cross-sectional view). An example STI process may involve STI mask photolithography, dry etch and clean, liner oxidation, STI filling and polishing (e.g., via chemical mechanical polishing or CMP) to generate the trench structures 418.

FIG. 4E depicts a process stage for forming an inter-gate oxide-nitride-oxide (ONO) layer 420 (which may include aspects of the inter-gate dielectric layer 214A) and a polysilicon control gate (CG) layer 422 (which may include aspects of the control gate 212A) over both the first and second regions 403A/403B of the substrate 402. A hard mask layer 424 comprising oxide-nitride material (e.g., a composite layer including at least an oxide layer and a nitride layer on top of the oxide layer) may be formed over the CG layer 422. In some examples, the ONO layer 420 may have a thickness of about 100 Å to 150 Å, without limitation. In some examples, the polysilicon CG layer 422 may have a thickness of about 300 Å to 600 Å, without limitation. Whereas an initial thickness of the hard mask layer 424 may be about 1500 Å to 2000 Å, it may be thinned to a suitable height in order to optimize the relative vertical difference between certain features of the first and second regions 403A, 403B as will be set forth further below.

FIG. 4F depicts a process stage where the gate stacks of a pair of adjacent bitcells are defined and respective gate spacers are formed in the Flash region 403A. As illustrated, gate stacks 485-1 and 485-2 with respect to bitcells 499-1 and 499-2 are formed over the FG layer 414 of the Flash region 403A, where reference numbers 427-1, 427-2 refer to respective inter-gate ONO dielectric components and reference numbers 426-1, 426-2 refer to respective CGs of the gate stacks 485-1 and 485-2 that are patterned from the ONO layer 420 and the polysilicon CG layer 422 shown in FIG. 4E. Because the components of a gate stack are also components of a bitcell, the terminology of bitcells and gate stacks may be used somewhat interchangeably with respect to some of the constituent components depending on the context unless otherwise expressly noted.

Continuing to refer to FIG. 4F and within the terminological equivalence framework set forth herein, spacers 428-1 and 428-2 (which may include aspects of the vertical spacer 230A) are formed along respective vertical sidewalls of CG 426-1 of the bitcell 499-1. The spacers may extend from the FG layer 414 to a top surface of a patterned hard mask component 423-1 (patterned from the hard mark layer 424 shown in FIG. 4E) overlying CG 426-1. In similar fashion, spacers 429-1 and 429-2 may be formed to cover respective vertical sidewalls of CG 426-2 of the bitcell 499-2 that may extend to the FG layer 414 and to a top surface of a patterned hard mask component 423-2 overlying CG 426-2. Depending on implementation, spacers 428-1/428-2 and 429-1/429-2 may each comprise one or more dielectric layers of suitable materials and thicknesses—e.g., a composite layer including at least an oxide layer and a nitride layer on the oxide layer. In some arrangements, the hard mask components 423-1 and 423-2 may be operable to protect the Flash bitcells 499-1 and 499-2 from subsequent processing steps in addition to acting as stop layers during the fabrication of wordline gates of the Flash bitcells 499-1 and 499-2, respectively. In some arrangements, respective sidewall spacers 428-1/428-2 and 429-1/429-2 may be selectively thinned or reduced to comply with applicable cell design rules.

FIG. 4G depicts a cell $V_T$ definition stage where a wordline side of the CG is opened to remove a portion of the vertical sidewall (e.g., provided as an offset spacer component thereof) and facilitate a suitable $V_T$ implant process with respect to the Flash bitcells. As illustrated, a photoresist layer 430 is patterned so as to expose the wordline sides of CGs 426-1 and 426-2 with respect to the bitcell pair 499-1/499-2.

FIG. 4H depicts that, after the cell $V_T$ implant, a polysilicon etch is performed for defining and forming respective FGs 432-1 and 432-2 from the FG layer 414 with respect to the bitcell pair 499-1/499-2.

FIG. 4I depicts that, after forming FGs 432-1 and 432-2, an oxide spacer may be formed on each vertical side of FGs 432-1 and 432-2 so as to provide isolation. As illustrated in FIG. 4I, oxide spacers 433-1 may be formed on each side of FG 432-1 of the bitcell 499-1 and oxide spacers 433-2 may be formed on each side of FG 432-2 of the bitcell 499-2.

FIG. 4J depicts that an isolation structure 477 may be provided overlying a common source area 434 disposed between the bitcells 499-1 and 499-2. In some examples, the oxide spacers 433-1 and 433-2 facing the common source area 434 are selectively removed (e.g., using a photolithography exposing the oxide spacers 433-1 and 433-2). Moreover, the spacers 428-2 and 429-1 proximate the common source area 434 may be at least thinned (e.g., using a photolithography exposing the spacers 428-2 and 429-1). Also, an implant process may selectively introduce dopants into the common source area 434. After forming the isolation structure 477, vertical tunnel oxide sidewalls 435-1 and 435-2 can be formed. As shown in FIG. 4J, respective portions of the FG oxide layer 412 underlying FGs 432-1 and 432-2 may extend to the isolation structure 477. Further, the isolation structure 477 may extend to the vertical tunnel oxide sidewalls 435-1 and 435-2.

In FIG. 4K, a wordline (WL) gate oxide mask 436 is shown that may be patterned for defining areas in the Flash region 403A where a WL gate oxide layer is to be formed with respect to the formation of WL gates (also referred to as access transistors or select transistors as previously noted) of the bitcells 499-1 and 499-2, respectively. As illustrated, the patterned WL gate oxide mask 436 exposes areas 479A and 479B adjacent to the bitcells 499-1 and 499-2, respectively, from which respective portions of the FG oxide layer 412 may be removed and a new oxide layer (also referred to as a first gate oxide layer in some examples) operable as WL gate oxide may be formed.

In FIG. 4L, a WL gate oxide layer 437 is grown in the exposed areas of the Flash region 403A, where the WL gate oxide layer 437 may have a thickness of about 15 Å to 35 Å and may comprise oxide material essentially devoid of nitridation. After forming the WL gate oxide layer 437 in the Flash region 403A, a polysilicon layer 438 may be deposited, as illustrated in FIG. 4L, for facilitating the formation of WL gates and a common erase gate. In certain fabrication methods involving processing of Flash bitcells and CMOS logic in a staggered parallel fashion, e.g., going back and forth between Flash processing and CMOS logic processing until both circuit portions are completed substantially simultaneously, the WL gate oxide layer 437 may be exposed to one or more nitridation process steps while the nitridation process steps provide nitridation for gate oxides for the CMOS logic transistors. Whereas such nitridation of gate oxide layer (e.g., for the CMOS logic transistors) is commonly employed to help mitigate the deleterious effects of hot electron degradation caused in transistor devices operating under high energy fields, examples herein "decouple" the processing of Flash bitcells from CMOS logic processing such that the Flash bitcells are substantially completed and covered by a protective layer as will be seen further below. In this manner, the gate oxides in access transistors (and other dielectric layers in the Flash bitcells) are substantially free of nitridation (e.g., exclusive of nitridation). Accordingly, the WL gate oxide layer 437 is comprised of material exclusive of nitridation.

FIG. 4M illustrates that the polysilicon layer 438 may be polished—e.g., utilizing a CMP process stopping on the hard mask layer 424 present in the second region 403B. Subsequently, as shown in FIG. 4M, a portion of the polysilicon layer 438 in the first region 403A over the patterned hard mask components 423-1 and 423-2 may be removed—e.g., utilizing an etch-back process stopping on the patterned hard mask components 423-1 and 423-2. As a result, the polysilicon material over the second region 403B is removed and a thinned polysilicon layer 440 having a thickness of about 500 Å to 1500 Å may be provided for forming WL gates and erase gate in the first region 403A.

FIG. 4N illustrates that a patterned photoresist or mask 442 may be provided for defining and forming WL gates 444-1 and 444-2 as well as common erase gate 445 with respect to the bitcell pair 499-1 and 499-2. As shown in FIG. 4N, WL gate 444-1 overlying a corresponding WL oxide portion 437 is provided as part of the bitcell 499-1, WL gate 444-2 overlying a corresponding WL oxide portion 437 is provided as part of the bitcell 499-2, and erase gate 445 is commonly associated with both bitcells 449-1 and 449-2, thus substantially corresponding to the structure of the bitcell pair 202A/202B described previously in reference to FIGS. 2A and 2B. After forming the WL gates 444-1 and 444-2, the patterned photoresist or mask 442 (and the hard mark layer 424 in the second region 403B) is removed.

After fabrication of the WL gates 444-1/444-2 and common erase gate 445, the formation of Flash bitcells 499-1 and 499-2 is substantially complete and the process flow may switch to forming CMOS logic circuitry according to some examples. In some arrangements, source/drain (S/D) extension regions (e.g., including lightly-doped drain (LDD) regions) may be formed (e.g., via suitable implantation techniques) with respect to the WL gates (e.g., WL gates 444-1/444-2) in the Flash region 403A and before commencing CMOS logic processing. In some additional and/or alternative arrangements, the formation of LDD regions in the Flash region 403A may be postponed (as described with reference to FIG. 4U) until after substantially completing the CMOS logic circuitry in the second region 403B.

In some examples, the CMOS logic processing may start with forming a protective layer 475 including a nitride sublayer 446 and an oxide sublayer 448 over the Flash region 403A and the second region 403B for sealing and protecting the circuitry of the Flash region 403A during the formation of CMOS logic circuitry in the second region 403B. Subsequently, as shown in FIG. 4O, the oxide sublayer 448 in the second region 403B may be removed—e.g., by utilizing a CMP process configured to stop on the nitride sublayer 446 in the second region 403B. In view of the Flash region 403A being recessed with respect to the second region 403B (e.g., the depth 409 of the recess 407 described with reference to FIG. 4C), a portion of the oxide sublayer 448 remains on the nitride sublayer 446—e.g., at the end of the CMP process. In this manner, the gate stacks 485-1/485-2, associated WL gates 444-1/444-2 and the common erase gate 445 of the circuitry of the Flash region 403A are sealed and protected during the formation of CMOS logic circuitry in the second region 403B. In other words, the protective layer 475 may initially extend over the second region 403B, which may be polished using CMP to a suitable thickness depending on the depth of the recessed area formed in the first region 403A such that only a portion of the protective layer 475 (e.g., the nitride sublayer 446) is remaining over the second region 403B. As illustrated in FIG. 4O, the CMP process may involve removing the oxide sublayer 448 from the second region 403A while the nitride sublayer 446 of the protective layer 475 remains extended over a polysilicon layer formed in the second region or area 403B, e.g., the CG polysilicon layer portion 422 used for forming CG gates in the first region 403A during the earlier stages of the Flash First flow described above. As such, the protective layer 475 may be polished such that a top surface of the protective layer 475 remaining in the first region 403A (e.g., the top surface of the remaining oxide sublayer 448 after CMP) and disposed over the Flash memory cells and associated gates is substantially coplanar with the nitride sublayer of the second area 403B.

Substantially completing the fabrication of Flash bitcells including the WL and erase gates associated therewith in a Flash First flow according to the teachings herein may be particularly advantageous over processing the CMOS logic circuitry before forming the Flash circuitry and/or substantially concurrently because the $V_T$ settings configured for different CMOS devices having variable operational voltages will not be disturbed by the process steps (e.g., high-temperature processes) involved in a subsequent or substantially concurrent Flash circuitry process flow.

FIG. 4P illustrates that various layers present above the FG oxide layer 412 are removed in the second region 403B. As shown in FIG. 4P (in comparison to FIG. 4O), the nitride sublayer 446, the CG polysilicon layer portion 422, the inter-gate ONO layer 420, and the FG layer 414 remaining in the second region 403B are removed. The remaining oxide sublayer 448 in the second region 403A may be at least partially removed as shown in FIG. 4P (in comparison to FIG. 4O) while the various layers present above the FG oxide layer 412 are removed in the second region 403B. Further, the FG oxide layer portion 412 remaining in the second region 403B may also be removed (not specifically shown in this Figure) in preparation for forming a logic gate oxide layer in a subsequent stage (e.g., gate oxide layer 450 illustrated in FIG. 4Q), which may be referred to as a second gate oxide layer in some examples herein. After forming the second gate oxide layer in the second region 403B, the second gate oxide layer may be substantially coplanar with a top surface of the Flash memory cells (e.g., a top surface of the WL gates 444, a top surface of the common erase gate 445, a top surface of the patterned hard mask components 423) formed in the first region 403A because the Flash region 403A is recessed with respect to the second region 403B as described above—e.g., the depth 409 of the recess 407. In some arrangements, a second gate oxide layer formed in the second region 403B, e.g., gate oxide layer 450 illustrated in FIG. 4Q, is within a range (e.g., ±200 Å to ±500 Å) with respect to the top surface of the Flash memory cells 499-1/499-2.

According to the examples herein, the second gate oxide layer 450 in the second region 403B may undergo a suitable nitridation process such that second gate oxide layer 450 can be more robust against hot electron degradation. Contrastingly, the WL gate oxide layer 437 (as well as the FG oxide layer 412) are not exposed to the nitridation process because of the various layers present over the WL gate oxide layer 437 (e.g., the WL gates 444, the nitride sublayer 446, the remaining oxide sublayer 448). Accordingly, the WL gate oxide layer 437 is exclusive of the nitridation. Further, although FIG. 4Q depicts one second gate oxide layer 450 in the second region 403B, the second region 403B may include more than one gate oxide layers having different thicknesses in different areas. For example, the second gate oxide layer 450 may be processed to have a range of thicknesses in different areas of the second region 403B, e.g., ranging from about 15 Å to about 200 Å, for facilitating the manufacture of transistors having different respective operational voltage levels, e.g., 1.0V, 1.5V, 3.3V and 5.0V, etc., as previously set forth. In general, logic transistors having higher operational voltages may be provided with a thicker gate oxide layer, whereas logic transistors having lower operational voltages may be formed with a thinner gate oxide layer. Regardless of the thickness of the different instances of the second gate oxide layer 450, it may be nitridated for NMOS devices, PMOS devices, or both, that form the CMOS logic circuitry, in order to reduce hot electron degradation that may be caused by high energy fields during their electrical operation as previously noted.

Continuing to refer to FIG. 4Q, a logic polysilicon layer 452 may be formed over the second gate oxide layer 450 in the second region 403B, which may extend over the remaining oxide sublayer 448 of the protective layer 475 in the first region 403A. In some examples, the logic polysilicon layer 452 may have a thickness of about 600 Å to 800 Å, without limitation.

FIG. 4R illustrates that a hard mask 454 comprising nitride material having a thickness of about 400 Å to 500 Å and a diamond-like carbon (DLC) hard mask 456 having a thickness of about 800 Å to 1000 Å are formed over the logic polysilicon layer 452. Although FIG. 4R shows the logic polysilicon layer 452, the hard mask 454, and the DLC hard mask 456 having a step across the first region 403A and the second region 403B for illustration purposes, the overall surface topography may be substantially flat (or smooth) in view of the Flash region 403A being recessed with respect to the second region 403B such that a height difference between the second gate oxide layer 450 and the top surface of the Flash memory cells 499 can be within a range (e.g., ±200 Å to ±500 Å). The hard mask 454 comprising nitride material and the DLC hard mask 456 facilitates logic gate patterning for high performance transistors. For example, a gate mask arrangement (not specifically shown) may be utilized in a suitable photolithography process for forming logic gates of appropriate lengths, e.g., 28 nanometers (nm), 34 nm, 36 nm, etc., in the second region 403B as illustrated in FIG. 4S.

In the arrangement illustrated in FIG. 4S, an NMOS device 471A including a gate 458-1 and a PMOS device 471B including a gate 458-2 are exemplified as CMOS logic devices in the second region 403B. Further, appropriate S/D extensions 460 and 462 (which may also be referred to as lightly-doped drain (LDD) regions) may be provided for the NMOS and PMOS devices 471A, 471B, respectively. In some examples, an embedded silicon-germanium (SiGe) layer 464 may be provided in PMOS device(s) 471B, as illustrated in FIG. 4T, for providing compressive stress in the channel region, which improves the PMOS device performance.

After fabricating the CMOS devices 471A, 471B including S/D extensions (e.g., LDD regions) therein, and depending on optional SiGe layer formation for the PMOS devices, an example process flow with respect to logic circuitry processing in the second region 403B is substantially completed and the flow may switch to further processing of Flash circuitry in some arrangements. In one example, LDD processing of the WL gates formed in the first region 403A may be effectuated at this juncture as illustrated in FIG. 4U, where a patterned photoresist 472 may be provided to cover the CMOS logic circuitry of the second region 403B while exposing the first region 403A. A suitable etch process (e.g., a wet HF etch) may be deployed to remove the remaining oxide sublayer 448 (and the nitride sublayer 446 of the protective layer 475 in some examples) from the first region 403A prior to Flash LDD processing in some examples. Appropriate LDD extensions 474-1, 474-2 may be formed with respect to WL gates 444-1/444-2, e.g., via suitable implant techniques.

Subsequently, the patterned photoresist 472 covering the second region 403B as well as the remaining nitride sublayer 446 (if not removed prior to the LDD processing) over the Flash bitcells 499-1/499-2 may be removed, as illustrated in FIG. 4V, whereupon the process flow may continue with suitable spacer formation, source/drain region formation, silicide formation process, PMD deposition process, contact formation and subsequent metallization processes according to applicable process stages depending on implementation. In some examples, the WL gates 444 or the common erase gate 445 of the Flash bitcells 499 may include a silicide layer (a silicide layer including tungsten, cobalt, or nickel, etc.) as a result of the silicide formation process.

Figure 5A:
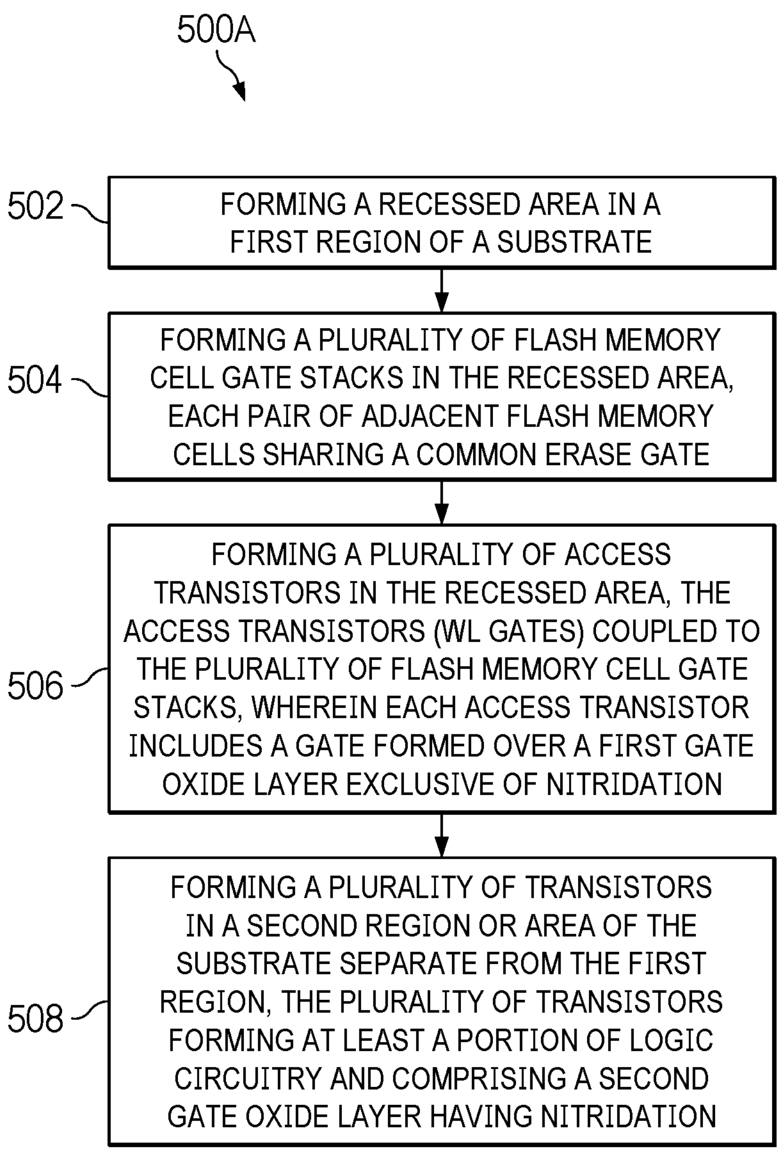
FIGS. 5A and 5B are flowcharts of an IC fabrication method according to some examples of the present disclosure.
Figure 5B:
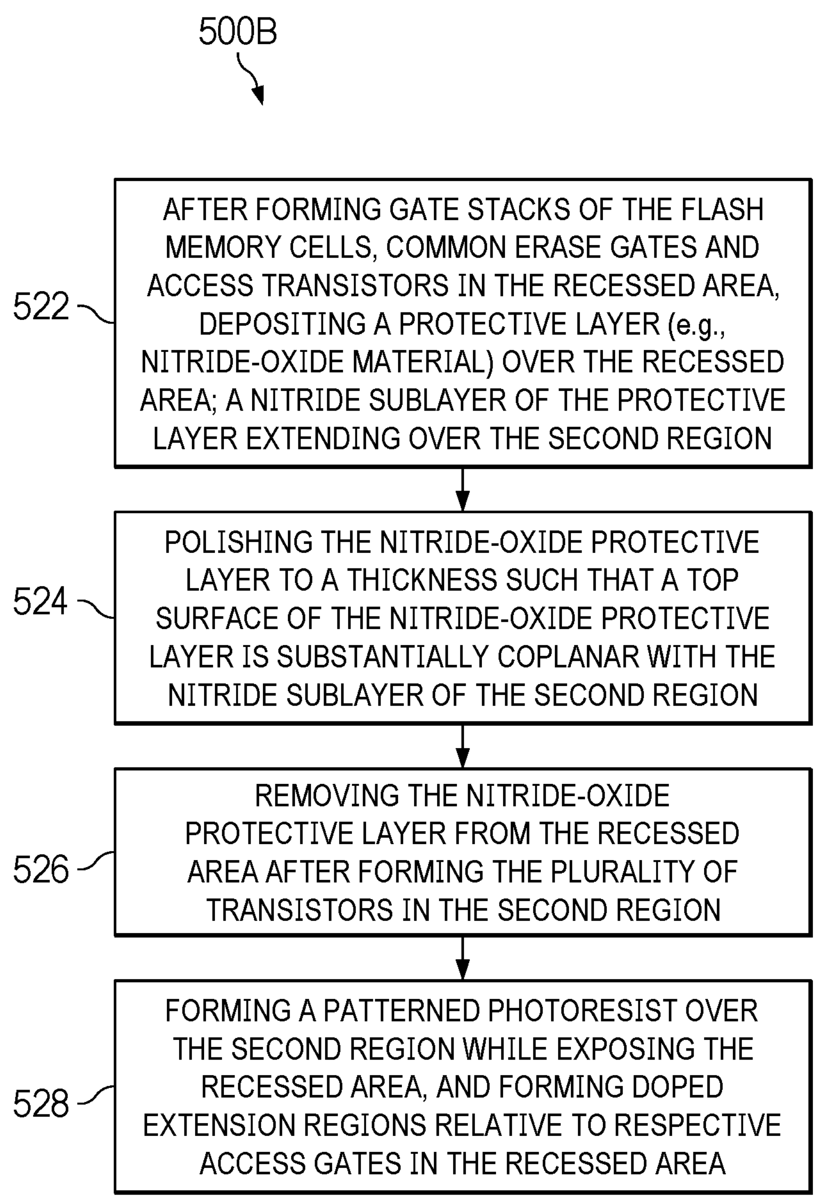

FIGS. 5A and 5B each depict a portion 500A, 500B, respectively, of a flowchart of an IC fabrication method according to some examples of the present disclosure, where the depicted steps, blocks, acts and/or functions of the flowchart portions may be combined and/or rearranged in various ways. At block 502, a recessed area may be formed in a first region or area of a substrate corresponding to a portion of a semiconductor process wafer. A plurality of Flash memory cell gate stacks may be formed in the recessed area, where each pair of adjacent Flash memory cells are configured to share a common erase gate (block 504). A plurality of access/WL transistors may be formed in the recessed area, the WL transistors coupled to respective ones of the plurality of Flash memory cell gate stacks in a split-gate architecture, where each WL transistor includes a WL gate formed over a first gate oxide layer essentially devoid or exclusive of nitridation (block 506). A plurality of transistors may be formed in a second region or area of the substrate separate from the first region, where the plurality of transistors may form at least a portion of logic circuitry, the transistors including a second gate oxide layer having nitridation (block 508).

In some arrangements, after forming gate stacks of the Flash memory cells, common erase gates and WL transistors in the recessed area, a protective layer (e.g., comprising nitride-oxide material) may be formed over the recessed area (block 522), where a nitride sublayer of the protective layer extends over a polysilicon layer formed in the second area or region. In some arrangements, the protective layer may be polished (e.g., using CMP) such that a top surface of the protective layer over the Flash memory cells including the WL gates is substantially coplanar with the nitride sublayer of the second area (block 524). In some arrangements, the nitride sublayer and the polysilicon layer may be removed from the second area prior to forming the transistors in the second area, with a remaining portion of the protective layer covering the Flash memory cells in the recessed area. After forming the transistors in the second area, the remaining portion of the protective layer may be removed from the recessed area (block 526). In some arrangements, a patterned photoresist may be formed over the second area while exposing the recessed first area, whereupon suitable doped extension regions may be formed relative to respective WL gates in the recessed first area (block 528).

Although some example implementations may involve NMOS-based split-gate Flash memory bitcells, the teachings herein are not limited thereto. Some example implementations may include PMOS-based Flash memory bitcells or non-split gate bitcell configurations in additional and/or alternative arrangements. Whereas various S/D implants, extension region implants (e.g., LDD implants) as well as additional implants such as halo/pocket implants, and the like may be used in some examples, not all such types of implants are required. Accordingly, a variety of bitline/drain implant profiles may be implemented where LDDs and/or halo/pocket implants are not necessary or may be optionally provided. Further, example implementations may involve various Flash architectures, e.g., single-level cell (SLC) Flash architectures (storing one bit of data per cell), multi-level cell (MLC) Flash architectures (storing more than one bit per cell), NAND-based Flash architectures, NOR-based Flash architectures, charge trap Flash architectures etc., as well as other types of NVM architectures.

While various examples of the present disclosure have been described above, they have been presented by way of example only and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the claims appended hereto and their equivalents.

For example, in this disclosure and the claims that follow, unless stated otherwise and/or specified to the contrary, any one or more of the layers set forth herein can be formed in any number of suitable ways, such as with spin-on techniques, sputtering techniques (e.g., Magnetron and/or ion beam sputtering), (thermal) growth techniques or deposition techniques such as chemical vapor deposition (CVD), physical vapor deposition (PVD), PECVD, or atomic layer deposition (ALD), etc. As another example, silicon nitride may be a silicon-rich silicon nitride or an oxygen-rich silicon nitride. Silicon nitride may contain some oxygen, but not so much that the materials dielectric constant is substantially different from that of high purity silicon nitride.

Further, in at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

The order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure. Likewise, although various examples have been set forth herein, not all features of a particular example are necessarily limited thereto and/or required therefor.

At least some portions of the foregoing description may include certain directional terminology, such as, "upper", "lower", "top", "bottom", "left-hand", "right-hand", "front side", "backside", "vertical", "horizontal", etc., which may be used with reference to the orientation of some of the Figures or illustrative elements thereof being described. Because components of some examples can be positioned in a number of different orientations, the directional terminology is used for purposes of illustration and is in no way limiting. Likewise, references to features referred to as "first", "second", etc., are not indicative of any specific order, importance, and the like, and such references may be interchanged, depending on the context, implementation, etc. Further, the features of examples described herein may be combined with each other unless specifically noted otherwise.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." In similar fashion, phrases such as "a plurality" or "multiple" may mean "one or more" or "at least one", depending on the context. All structural and functional equivalents to the elements of the above-described implementations are expressly incorporated herein by reference and are intended to be encompassed by the claims appended below.

What is claimed is:

1. An integrated circuit (IC), comprising:
- a substrate including a first area;
- a Flash memory cell gate stack formed in the first area;
- a wordline (WL) transistor formed in the first area and coupled with the Flash memory cell gate stack, the WL transistor including a WL gate formed over a first gate oxide layer;
- a transistor formed in a second area of the substrate separate from the first area, the transistor forming at least a portion of logic circuitry of the IC and including a second gate oxide layer, wherein the transistor includes a silicon-germanium (SiGe) layer; and
- one or more sets of transistors formed in the second area including the transistor, each set of transistors operable at respective voltage levels.

2. The IC as recited in claim 1, wherein the first gate oxide layer has a thickness of about 15 Å to 35 Å.

3. The IC as recited in claim 1, wherein the WL gate has a thickness of about 500 Å to 1500 Å.

4. The IC as recited in claim 1, wherein the transistor includes a gate on the second gate oxide layer, the gate having a thickness of about 600 Å.

5. The IC as recited in claim 1, wherein the Flash memory cell gate stack comprises a floating gate having a thickness of about 200 Å to 250 Å and a control gate over the floating gate, the control gate having a thickness of about 300 Å to 500 Å.

6. The IC as recited in claim 1, wherein the Flash memory cell gate stack is adjacent to another Flash memory cell gate stack with a common erase gate between the Flash memory cell gate stacks.

7. The IC as recited in claim 1, wherein the first area is recessed with respect to the second gate oxide layer.

8. The IC as recited in claim 1, wherein the second gate oxide layer is substantially coplanar with a top surface of the Flash memory cell gate stack.

9. The IC as recited in claim 1, wherein the second gate oxide layer has a thickness ranging from about 15 Å to about 250 Å based on the respective voltage levels.

10. A method of fabricating an integrated circuit (IC), comprising:
- forming a first area in a substrate;
- forming a Flash memory cell gate stack in the first area;
- forming a wordline (WL) transistor in the first area, the WL transistor coupled with the Flash memory cell gate stack, wherein the WL transistor includes a WL gate formed over a first gate oxide layer;
- forming a transistor in a second area of the substrate separate from the first area, the transistor forming at least a portion of logic circuitry of the IC and including a second gate oxide layer, wherein the transistor includes a silicon-germanium (SiGe) layer; and
- forming one or more sets of transistors in the second area including the transistor, each set of transistors operable at respective voltage levels.

11. The method as recited in claim 10, wherein the first area is recessed with respect to the second gate oxide layer.

12. The method as recited in claim 10, wherein the second gate oxide layer is substantially coplanar with a top surface of the Flash memory cell gate stack.

13. The method as recited in claim 10, wherein the Flash memory cell gate stack is adjacent to another Flash memory cell gate stack with a common erase gate between the Flash memory cell gate stacks.

14. The method as recited in claim 10, wherein the Flash memory cell gate stack and the WL transistor are formed before forming the transistor in the second area.

15. The method as recited in claim 14, further comprising:
- depositing a protective layer over the Flash memory cell gate stack and the WL transistor, wherein a nitride sublayer of the protective layer extends over a polysilicon layer formed in the second area; and
- polishing the protective layer such that a top surface of the protective layer over the Flash memory cell gate stack and the WL transistor is substantially coplanar with the nitride sublayer of the second area.

16. The method as recited in claim 15, further comprising:
- removing the nitride sublayer and the polysilicon layer from the second area;
- forming the transistor in the second area with a remaining portion of the protective layer covering the Flash memory cell gate stack and the WL transistor in the first area; and
- removing the remaining portion of the protective layer from the first area after forming the transistor in the second area.

17. The method as recited in claim 10, wherein the Flash memory cell gate stack comprises a floating gate having a thickness of about 200 Å to 250 Å and a control gate over the floating gate, the control gate having a thickness of about 300 Å to 500 Å.

18. The method as recited in claim 10, wherein:
- the first gate oxide layer is exclusive of nitridation; and
- the second gate oxide layer has nitridation.

19. The IC as recited in claim 1, wherein:
- the first gate oxide layer is exclusive of nitridation; and
- the second gate oxide layer has nitridation.

20. The IC as recited in claim 7, wherein the recess has a depth of about 1000 Å to 1200 Å with respect to the second gate oxide layer.

21. The method as recited in claim 10, wherein the second gate oxide layer has a thickness ranging from about 15 Å to about 250 Å based on the respective voltage levels.

22. The method as recited in claim 11, wherein the recess has a depth of about 1000 Å to 1200 Å with respect to the second gate oxide layer.

* * * * *